(12) United States Patent
Okada et al.

(10) Patent No.: US 6,232,640 B1
(45) Date of Patent: May 15, 2001

(54) SEMICONDUCTOR DEVICE PROVIDED WITH A FIELD-EFFECT TRANSISTOR AND METHOD OF MANUFACTURING THE SAME

(75) Inventors: Masakazu Okada; Keiichi Higashitani, both of Hyogo (JP)

(73) Assignee: Mitsubishi Denki Kabishiki Kaisha, Tokyo (JP)

( * ) Notice: Subject to any disclaimer, the term of this patent is extended or adjusted under 35 U.S.C. 154(b) by 0 days.

(21) Appl. No.: 09/413,513

(22) Filed: Oct. 6, 1999

(30) Foreign Application Priority Data

Apr. 30, 1999 (JP) .................................... 11-123899

(51) Int. Cl.$^7$ .................................................. H01L 29/72
(52) U.S. Cl. .......................... 257/374; 257/369; 257/371; 257/382; 257/384; 257/408
(58) Field of Search ..................... 257/369, 371, 257/374, 382, 384, 408

(56) References Cited

U.S. PATENT DOCUMENTS 6,049,113 * 4/2000 Shida .................................. 257/369

FOREIGN PATENT DOCUMENTS

| 7-29993 | 1/1995 | (JP) . |
| 9-74199 | 3/1997 | (JP) . |
| 9-172063 | 6/1997 | (JP) . |

\* cited by examiner

*Primary Examiner*—Edward Wojciechowicz
(74) *Attorney, Agent, or Firm*—McDermott, Will & Emery

(57) ABSTRACT

A semiconductor device can reduce a leak current, and a manufacturing method can provide such a semiconductor device.

A semiconductor device includes an isolating and insulating film formed on a main surface of a semiconductor substrate including a first conductivity type region, and also includes a field-effect transistor. The field-effect transistor includes a second conductivity type region neighboring to the isolating and insulating film, a gate electrode, a lower layer side wall film formed on a side surface of the gate electrode, an upper layer side wall film formed on the lower layer side wall film and containing a material different from that of the lower layer side wall film, and a high-melting-point metal silicide layer formed on the second conductivity type region. The upper surface of the isolating and insulating film is located at a level substantially equal to or lower than the main surface of the semiconductor substrate and higher than a junction boundary surface between the first and second conductivity type regions.

18 Claims, 19 Drawing Sheets

SEMICONDUCTOR DEVICE PROVIDED WITH A FIELD-EFFECT TRANSISTOR AND METHOD OF MANUFACTURING THE SAME

BACKGROUND OF THE INVENTION

1. Field of the Invention

The present invention relates to a semiconductor device and a method of manufacturing the same, and particularly a semiconductor device which can suppress generation of a leak current as well as a method of manufacturing the same.

2. Description of the Background Art

Semiconductor devices provided with field-effect transistors have been known. FIG. 30 is a schematic cross section showing a semiconductor device in the prior art. Referring to FIG. 30, description will now be given on a conventional semiconductor device.

In FIG. 30, a semiconductor device is provided with field-effect transistors 138a and 138b formed on a semiconductor substrate 101. Further, a p-well 102 and an n-well 103 are formed at semiconductor substrate 101. An isolating oxide film 104 is formed at a main surface of semiconductor substrate 101 for isolating element formation regions from each other. In a region provided with p-well 102, n$^-$-type impurity diffusion regions 110a and 110b as well as n$^+$-type impurity diffusion regions 111a and 111b are formed at the main surface of semiconductor substrate 101. These n$^-$-type impurity diffusion regions 110a and 110b as well as n$^+$-type impurity diffusion regions 111a and 111b form source/drain regions. In a channel region located between n$^-$-type impurity diffusion regions 110a and 110b, a gate electrode 106a is formed on the main surface of semiconductor substrate 101 with a gate insulating film 105a therebetween. Side walls 107a and 107b made of TEOS oxide films are formed on side surfaces of gate electrode 106a, respectively. High-melting-point metal silicide layers 108a–108c are formed on gate electrode 106a and n$^+$-type impurity diffusion regions 111a and 111b. Gate electrode 106a and gate insulating film 105a as well as source/drain regions 110a, 110b, 111a and 111b form field-effect transistor 138a.

In the region provided with n-well 103, p$^-$-type impurity diffusion regions 112a and 112b as well as p$^+$-type impurity diffusion regions 113a and 113b are formed at the main surface of semiconductor substrate 101. These p$^-$-type impurity diffusion regions 112a and 112b as well as p$^+$-type impurity diffusion regions 113a and 113b form the source/drain regions. On a channel region located between p$^-$-type impurity diffusion regions 112a and 112b, a gate electrode 106b is formed on the main surface of semiconductor substrate 101 with a gate insulating film 105b therebetween. Side walls 107c and 107d made of TEOS oxide films are formed on the side surfaces of gate electrode 106b, respectively. High-melting-point metal silicide layers 108d and 108e are formed on the p$^+$-type impurity diffusion regions 113a and 113b, respectively. Gate electrode 106b, gate insulating film 105b and source/drain regions 112a, 112b, 113a and 113b form field-effect transistor 138b. A silicide protection film 109 made of a TEOS oxide film is formed on gate electrode 106b and source/drain regions 112a, 112b, 113a and 113b.

An interlayer nitride film 114, which serves as an etching stopper when forming an opening 129, is formed on field-effect transistors 138a and 138b and isolating oxide film 104. An interlayer insulating film 115 is formed on interlayer nitride film 114. In a region located above n$^+$-type impurity diffusion region 111a, interlayer insulating film 115 and interlayer nitride film 114 are partially removed by etching, and thereby an opening 129 is formed. A metal electrode 116 is formed in opening 129 and on interlayer insulating film 115. An interconnection 130 is formed on interlayer insulating film 115.

Referring to FIGS. 31–35, description will be given on steps of manufacturing the semiconductor device shown in FIG. 30. FIGS. 31 to 35 are schematic cross sections showing a method of manufacturing the semiconductor device shown in FIG. 30.

First, isolating oxide film 104 (see FIG. 31) is formed at the main surface of semiconductor substrate 101 (see FIG. 31) to isolate the element formation regions from each other. Then, an ion implantation method is executed to form p- and n-wells 102 and 103 at the main surface of semiconductor substrate 101. By thermally oxidizing the main surface of semiconductor substrate 101, an oxide film which will form the gate insulating film is formed on the main surface of semiconductor substrate 101. This oxide film has a film thickness of about several nanometers. A polycrystalline silicon film which will form the gate electrode is formed on this oxide film. This polycrystalline silicon film has a film thickness of about tens of nanometers. A resist pattern is formed on this polycrystalline silicon film. Using this resist pattern as a mask, etching is effected to remove portions of the polycrystalline silicon film and the insulating film so that gate insulating films 105a and 105b as well as gate electrodes 106a and 106b (see FIG. 31) are formed. Thereafter, the resist pattern is removed. An ion implanting method is executed to form n$^-$-type impurity diffusion regions 110a and 110b as well as p$^-$-type impurity diffusion regions 112a and 112b at the main surface of semiconductor substrate 101. Thereafter, a TEOS oxide film 117 is deposited on gate electrodes 106a and 106b, the main surface of semiconductor substrate 101 and isolating oxide film 104. TEOS oxide film 117 has a film thickness of about 60 nm. In this manner, the structure shown in FIG. 31 is obtained.

As shown in FIG. 32, etchback is effected to remove partially TEOS oxide film 117. Thereby, side walls 107a–107d are formed on the side surfaces of gate electrodes 106a and 106b, respectively. The etching for removing TEOS oxide film 117 causes over-etching of about 40%. Therefore, the upper surface portion of isolating oxide film 104 is removed by a thickness A. More specifically, TEOS oxide film 117 is removed by about 60 nm in thickness, and a portion of thickness A (which is also referred to as a "removal thickness A" or a "drop amount" hereinafter) of about 25 nm is removed from isolating oxide film 104.

As shown in FIG. 32, the ion implanting method is executed to implant n- and p-type impurities into the main surface of semiconductor substrate 101. Thereby, n$^+$-type impurity diffusion regions 111a and 111b as well as p$^+$-type impurity diffusion regions 113a and 113b are formed.

As shown in FIG. 33, a TEOS oxide film 118 is then deposited on gate electrodes 106a and 106b, the main surface of semiconductor substrate 101 and isolating oxide film 104. TEOS oxide film 118 has a film thickness of about 100 nm. A resist pattern 119 is formed on TEOS oxide film 118.

Then, as shown in FIG. 34, TEOS oxide film 118 masked with resist pattern 119 is partially removed by etching so that silicide protection film 109 made of the TEOS oxide film is formed. Thereafter, resist pattern 119 is removed.

This etching for partially removing TEOS oxide film 118 likewise causes over-etching of about 40%. This over-etching removes the upper surface portion having a film thickness B from isolating oxide film 104 as shown in FIG.

34. In this case, since TEOS oxide film 118 has a film thickness of 100 nm, and the removed portion of isolating oxide film 104 has film thickness B (which will also be referred to as a "removal thickness" or a "drop amount" hereinafter) of about 40 nm.

A high-melting-point metal film is formed on gate electrode 106a, the main surface of semiconductor substrate 101, isolating oxide film 104 and silicide protection film 109 by a sputtering method. Lamp annealing is executed as thermal treatment. As a result, a silicide reaction occurs at the main surface of semiconductor substrate 101 and the upper surface of gate electrode 106a, and particularly at contact portions where silicon and polycrystalline silicon are in contact with the high-melting-point metal film. Consequently, high-melting-point metal silicide layers 108a–108e (see FIG. 35) are formed. Thereafter, the unreacted high-melting-point metal layer is removed so that the structure shown in FIG. 35 is formed.

After the above steps, interlayer nitride film 114 is deposited on the entire surface of semiconductor substrate 101. Further, interlayer insulating film 115 is deposited on interlayer nitride film 114. The upper surface of interlayer insulating film 115 is flattened by a CMP (Chemical Mechanical Polishing) method. A resist pattern is formed on interlayer insulating film 115. Using this resist pattern as a mask, interlayer insulating film 115 and interlayer nitride film 114 are partially removed to form opening 129. In this etching process for forming opening 129, etching conditions providing a high selectivity of interlayer insulating film 115 to nitride film 114 ((an etch rate of interlayer insulating film 115)/(an etch rate of nitride film 114)) are first employed for removing interlayer insulating film 115 and stopping the progress of etching in interlayer nitride film 114. Thereafter, interlayer nitride film 114 is etched under different etching conditions. Then, metal electrode 116 and interconnection 130 are formed. In this manner, the semiconductor device shown in FIG. 30 is obtained.

However, the conventional semiconductor device described above suffers from the problems, which will now be described with reference to FIGS. 36 and 37.

FIG. 36 is a schematic fragmentary cross section showing, on an enlarged scale, an ideal semiconductor device. FIG. 37 is a schematic fragmentary cross section showing, on an enlarged scale, the semiconductor device, and particularly shows objects to be achieved by the invention.

Referring to FIG. 36, a field-effect transistor 138a is formed on the main surface of semiconductor substrate 101. It is preferable that isolating oxide film 104 neighboring to $n^+$-type impurity diffusion regions 111a and 111b of field-effect transistor 138a has the upper surface located at the substantially same level as the main surface of semiconductor substrate 101. In this case, p-well 102 can be kept at a potential different from that of $n^+$-type impurity diffusion regions 111a and 111b. For example, +2 V may be placed on $n^+$-type impurity diffusion regions 111a and 111b, and ±0 V may be placed on p-well 102, in which case a reverse bias occurs so that only a little current of tens of fA/$\mu m^2$ occurs.

In the conventional semiconductor device shown in FIG. 30, the upper surface of isolating oxide film 104 is located at a lower level than the main surface of semiconductor substrate 101 as shown in FIG. 37. This is because the upper surface of isolating oxide film 104 is over-etched in the etching process, which is executed for forming side walls 107a–107d and silicide protection films 109. The drop amount of the upper surface of isolating oxide film 104 (i.e., a sum of thickness A of the portion removed by the over-etching in the etching process for forming side walls 107a–107d and thickness B of the portion removed by the over-etching in the etching process for forming silicide protection film 109) is larger than a depth Xj of $n^+$-type impurity diffusion regions 111a and 111b. In this case, as can be seen in regions 100, each of high-melting-point metal silicide layers 108a and 108c is formed over not only $n^+$-type impurity diffusion region 111a (or 111b) but also p-well 102. Therefore, $n^+$-type impurity diffusion regions 111a and 111b are short-circuited to p-well 102 via high-melting-point metal silicide layers 108a and 108c, respectively. Consequently, such a disadvantage occurs that $n^+$-type impurity diffusion regions 111a and 111b carry the same potential as p-well 102, or that a large leak current flows even when $n^+$-type impurity diffusion regions 111a and 111b carry the potential different from that of p-well 102. For example, when $n^+$-type impurity diffusion regions carry +2 V and p-well 102 carries ±0 V, a reverse bias occurs at the junction boundary surface between the above region and the well, but a large leak current (of hundreds of femtoamperes or more) occurs via high-melting-point metal silicide layers 108a and 108c. The above problem likewise occurs between n-well 103 and $p^+$-type impurity diffusion regions 113a and 113b in field-effect transistor 138b.

When the large leak current flows as described above, the semiconductor device malfunctions, and reliability of the semiconductor device is remarkably reduced.

SUMMARY OF THE INVENTION

An object of the invention is to provide a semiconductor device which can suppress generation of a leak current.

Another object of the invention is to provide a method of manufacturing a semiconductor device which can suppress generation of a leak current.

According to an aspect of the invention, a semiconductor device includes an isolating and insulating film and a field-effect transistor. The isolating and insulating film is formed on a main surface of a semiconductor substrate including a first conductivity type region to isolate an element formation region. The field-effect transistor is formed in the element formation region. The field-effect transistor includes a second conductivity type region, a gate electrode, a lower layer side wall film, an upper layer side wall film and a high-melting-point metal silicide layer. The second conductivity type region is formed at the main surface of the semiconductor substrate and neighbors to the isolating and insulating film. The gate electrode is formed on the main surface of the semiconductor substrate. The lower layer side wall film is formed on a side surface of the gate electrode. The upper layer side wall film is formed on the lower layer side wall film, and contains a material different from that of the lower layer side wall film. The high-melting-point metal silicide layer is formed on the second conductivity type region. The upper surface of the isolating and insulating film is located at a level substantially equal to or lower than the main surface of the semiconductor substrate and higher than a junction boundary surface between the first and second conductivity type regions.

As described above, the device includes the lower layer side wall film and the upper layer side wall film. Therefore, the etching process for forming side walls can be divided into two steps. Consequently, a thickness (drop amount) of a portion of an isolating and insulating film, which is removed by over-etching in the etching process, can be smaller than that in a conventional case where the side walls are formed by only one etching step. As described above, such a structure that the upper surface of the isolating and insulating film is located at a higher level than the junction boundary surface between the first and second conductivity type regions can be employed in the semiconductor device, which includes the isolating and insulating film having the upper surface located at the level substantially equal to or lower than the main surface of the semiconductor substrate, and also includes the side wall films on the side surfaces of the gate electrode. Accordingly, it is possible to prevent effectively such a structure that the high-melting-point metal silicide layer is formed in contact with both the second and first conductivity type regions. Consequently, such a situation can be prevented that the first and second conductivity type regions are electrically connected via the high-melting-point metal silicide layer. Thereby, it is possible to prevent increase in leak current between the second and first conductivity type regions.

In the semiconductor device of the above aspect, the field-effect transistor may include a high-melting-point metal silicide layer formed on the gate electrode.

In this case, the electric resistance of the gate electrode can be effectively reduced. As a result, an operation speed of the semiconductor device can be improved.

In the semiconductor device of the above aspect, the field-effect transistor may include a first field-effect transistor including a high-melting-point metal silicide layer formed on the gate electrode, and a second field-effect transistor not including a high-melting-point metal silicide layer formed on the gate electrode.

In the semiconductor device of the above aspect, the lower layer side wall film may extend from a position on the upper surface of the gate electrode of the second field-effect transistor to a region neighboring to a region located on the second conductivity type region and provided with the high-melting-point metal silicide layer.

In this case, the lower layer side wall film can be utilized as a silicide protection film for preventing siliciding of the gate electrode during formation of the high-melting-point metal silicide layer. Therefore, the steps required for manufacturing the semiconductor device can be reduced in number compared with the case where the lower layer side wall film and this silicide protection film are formed in different steps, respectively. Consequently, the manufacturing cost of the semiconductor device can be reduced.

Only one etching step is required for forming the lower layer side wall film and the silicide protection film. Therefore, the isolating and insulating film is over-etched only one time. Accordingly, it is possible to reduce reliably the thickness of the portion of the isolating and insulating film which is removed by the over-etching. Accordingly, such a situation can be prevented that the upper surface of the isolating and insulating film is excessively removed by the over-etching, and thereby the surfaces of both the first and second conductivity type regions are exposed. Consequently, it is possible to prevent formation of the high-melting-point metal silicide layer extending from the position above the second conductivity type region to the position on the first conductivity type region. As a result, it is possible to prevent reliably increase in leak current which may be caused by such presence of the high-melting-point metal silicide layer.

In the semiconductor device of the above aspect, the upper and lower layer side wall films may extend from a position above the upper surface of the gate electrode of the second field-effect transistor to a region neighboring to a region located on the second conductivity type region and provided with the high-melting-point metal silicide layer.

In the above case, both the upper and lower layer side wall films can be used as the silicide protection films. Therefore, the thickness of the lower layer side wall film can be reduced as compared with the case where only the lower layer side wall film is used as the silicide protection film. As a result, it is possible to reduce further the thickness of the portion of the isolating and insulating film, which is removed by the over-etching in the etching process for forming the lower layer side wall film, even if the over-etching rate remains the same. Accordingly, formation of the high-melting-point metal silicide layer, which extends from the second conductivity type region to the first conductivity type region, can be reliably prevented. Therefore, increase in leak current can be prevented more reliably.

The semiconductor device of the above aspect may further include a coating film formed at the same layer level as the lower layer side wall film of the second field-effect transistor for covering the isolating and insulating film.

Since the coating film covering the isolating and insulating film is present, this coating film can be utilized as a protection film of the isolating and insulating film. Therefore, etching of the isolating and insulating film can be prevented. Thereby, the thickness of the portion of the isolating and insulating film, which is removed by the over-etching, can be equal to zero. Accordingly, formation of the high-melting-point silicide layer extending from the second conductivity type region to the first conductivity type region can be reliably prevented. Consequently, disadvantageous increase in leak current can be reliably prevented.

A single film can be deposited on the side surfaces of the gate electrode of the second field-effect transistor and the isolating and insulating film, and then can be etched, whereby the coating film and the lower layer side wall film can be formed in the same step. Consequently, the steps required for manufacturing the semiconductor device can be reduced in number, compared with the case where the coating film and the lower layer side wall film are formed in different steps, respectively. Accordingly, the manufacturing cost of the semiconductor device can be further reduced.

In the semiconductor device of the above aspect, the coating film may include a coating film portion formed at the same layer level as the upper layer side wall film of the second field-effect transistor.

In this case, the coating film can be utilized as an etching stopper in the process of forming the contact hole by partially removing an interlayer insulating film, which is made of a material different from that of the upper layer side wall film and is formed on the upper layer side wall film. Consequently, the steps required for manufacturing the semiconductor device can be smaller than that in the conventional case where an etching stopper used for forming the contact hole is formed in an additional step.

The semiconductor device of the above aspect may further include a gate electrode coating film formed on only the upper surface of the gate electrode of the second field-effect transistor.

In this case, as will be discussed in connection with manufacturing steps, a film which will form the gate electrode coating film may be formed in advance on a conductive film which will form the gate electrode, whereby the gate electrode coating film can be formed at the same time as the gate electrode by performing the etching only one time. This gate electrode coating film can be utilized as the silicide protection film. As a result, it is possible to reduce the number of steps required for manufacturing the semiconductor device compared with the case where the silicide protection film is formed on the gate electrode in an independent step.

In the semiconductor device of the above aspect, the isolating and insulating film may be of a trench type.

In the semiconductor device of the above aspect, the upper layer side wall film may include a silicon nitride film, and the lower layer side wall film may include a silicon oxide film.

In a method of manufacturing a semiconductor device according to another aspect of the invention, an isolating and insulating film isolating an element formation region is formed at a main surface of a semiconductor substrate including a first conductivity type region. In the element formation region, a second conductivity type region neighboring to the isolating and insulating film is formed at the main surface of the semiconductor substrate. A gate electrode is formed on the semiconductor substrate. A first coating film is formed on the gate electrode and the isolating and insulating film. A second coating film including a material different from that of the first coating film is formed on the first coating film. Anisotropic etching is effected to remove the second coating film on the isolating and insulating film and form an upper layer side wall film formed of the second coating film on the side surface of the gate electrode. Etching is effecting to remove the first coating film on the isolating and insulating film such that the upper surface of the isolating and insulating film is located at the lower level than the main surface of the semiconductor substrate and at the higher level that a junction boundary surface between the first and second conductivity type regions, and to form a lower layer side wall film made of the first coating film on the side surface of the gate electrode. A high-melting-point metal silicide layer is formed on the second conductivity type region.

According to the above method, since the upper surface of the isolating and insulating film is located above the junction boundary surface between the first and second conductivity type regions, the first conductivity type region is not exposed during formation of the high-melting-point metal silicide layer. Therefore, it is possible to prevent formation of the high-melting-point metal silicide layer extending from a position above the second conductivity type region to a position above the first conductivity type region. Consequently, it is possible to prevent electrical connection between the first and second conductivity type regions via a high-melting-point metal silicide layer. Accordingly, it is possible to prevent increase in leak current between the second and first conductivity type regions.

The method of manufacturing the semiconductor device of the above aspect may further include a step of forming a high-melting-point metal silicide layer on the gate electrode.

In the method of manufacturing the semiconductor device of the above aspect, a third coating film may be formed on the gate electrode and the isolating and insulating film after forming the lower layer side wall film. A fourth coating film made of the third coating film may be formed on the gate electrode by removing the third coating film on the isolating and insulating film such that the upper surface of the isolating and insulating film is located at a lower level than the main surface of the semiconductor substrate and at a higher level than a junction boundary surface between the first and second conductivity type regions. The fourth coating film may be used as a silicide protection film in the step of forming the high-melting-point metal silicide layer.

In this case, the upper surface of the isolating and insulating film is located above the junction boundary surface between the first and second conductivity type regions even after the step of forming the silicide protection film. Therefore, it is possible to prevent formation of the high-melting-point metal silicide layer extending from a position above the second conductivity type region to a position above the first conductivity type region. Consequently, increase in leak current between the first and second conductivity type regions can be reliably prevented.

In the method of manufacturing the semiconductor device of the above aspect, the step of forming the lower layer side wall film may include formation of the lower layer side wall film extending onto an upper surface of the gate electrode. The lower layer side wall film may be used as a silicide protection film in the step of forming the high-melting-point metal silicide layer.

In this case, the steps required for manufacturing the semiconductor device can be reduced in number compared with the case of forming an independent silicide protection film. Consequently, the manufacturing cost of the semiconductor device can be reduced.

Formation of the silicide protection film does not require an etching step independent of the etching step for forming the lower layer side wall film. Thus, the silicide protection film and the lower layer side wall film can be formed by performing the etching step only one time. Therefore, the upper surface of the isolating and insulating film can be reliably located at a higher level than the junction boundary surface between the first and second conductivity type regions.

In the method of manufacturing the semiconductor device of the above aspect, the step of forming the upper layer side wall film may include formation of the upper layer side wall film extending onto the upper surface of the gate electrode. The upper and lower layer side wall films may be used as a silicide protection film in the step of forming the high-melting-point silicide layer.

In this case, the thickness of the lower layer side wall film can be reduced as compared with the case where only the lower layer side wall film is used as the silicide protection film. In the etching step of forming the lower layer side wall film, therefore, it is possible to reduce further the thickness of the portion of the isolating and insulating film removed by the over-etching. Accordingly, the upper surface of the isolating and insulating film can be reliably located at a higher level than the junction boundary surface between the first and second conductivity type regions. Accordingly, it is possible to prevent reliably formation of the high-melting-point metal silicide layer extending over the first and second conductivity type regions. Consequently, increase in leak current between the first and second conductivity type regions can be reliably prevented.

In the method of manufacturing the semiconductor device of the above aspect, the step of forming the gate electrode may include the steps of forming a conductive film on the semiconductor substrate; forming on the conductive film a gate coating film used as a silicide protection film in the step of forming the high-melting-point silicide layer; and forming the gate electrode and the silicide protection film by partially removing the conductive film and the gate coating film by etching.

In this case, the gate electrode and the silicide protection film can be formed in the same step. Consequently, the steps required for manufacturing the semiconductor device can be reduced in number.

Since the gate coating film forming the silicide protection film can be reliably formed on the gate electrode, siliciding of the gate electrode can be reliably prevented.

In a method of manufacturing a semiconductor device according to still another aspect of the invention, an isolating and insulating film isolating an element formation region is formed at a main surface of a semiconductor substrate including a first conductivity type region. In the element formation region, a second conductivity type region neighboring to the isolating and insulating film is formed at the main surface of the semiconductor substrate. A gate electrode is formed on the semiconductor substrate. A first coating film is formed on the gate electrode and the isolating and insulating film. A second coating film is formed on the first coating film. Anisotropic etching is effected to remove partially the first and second coating films such that a surface of the second conductivity type region is exposed, and the first and second coating films are left on the gate electrode and the isolating and insulating film. A high-melting-point metal silicide layer is formed on the exposed surface of the second conductivity type region while leaving the first and second coating films on the gate electrode and the isolating and insulating film.

Since the first and second coating films are left on the isolating and insulating film, the upper surface of the isolating and insulating film can be prevented from being over-etched by the etching effected for removing the first and second coating films. Thereby, the upper surface of the isolating and insulating film can be prevented from being partially removed by the etching. As a result, the upper surface of the isolating and insulating film can be reliably located at a higher level than a junction boundary surface between the first and second conductivity type regions. Consequently, formation of the high-melting-point metal silicide layer extending over the first and second conductivity type regions can be reliably prevented. Consequently, increase in leak current between the first and second conductivity type regions can be prevented.

The second coating film can be utilized as an etching stopper in the process of forming the contact hole by effecting etching to remove partially an interlayer insulating film, which is made of a material different from that of the second coating film and is formed on the second coating film. Consequently, the steps required for manufacturing the semiconductor device can be reduced in number as compared with the case of forming an independent film used as the etching stopper.

The method of manufacturing the semiconductor device of the above aspect may include a step of forming a side wall film on the side surface of the gate electrode.

In this case, the side wall film may be formed prior to the step of forming the second conductivity type region, whereby it is possible to prevent expansion of the second conductivity type region to a region located under the end of the gate electrode, and thereby the position of the region in which the second conductivity type region is formed can be controlled more accurately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. The same members bear the same reference numbers, and description of them will not be repeated.

(First Embodiment)

Figure 1:
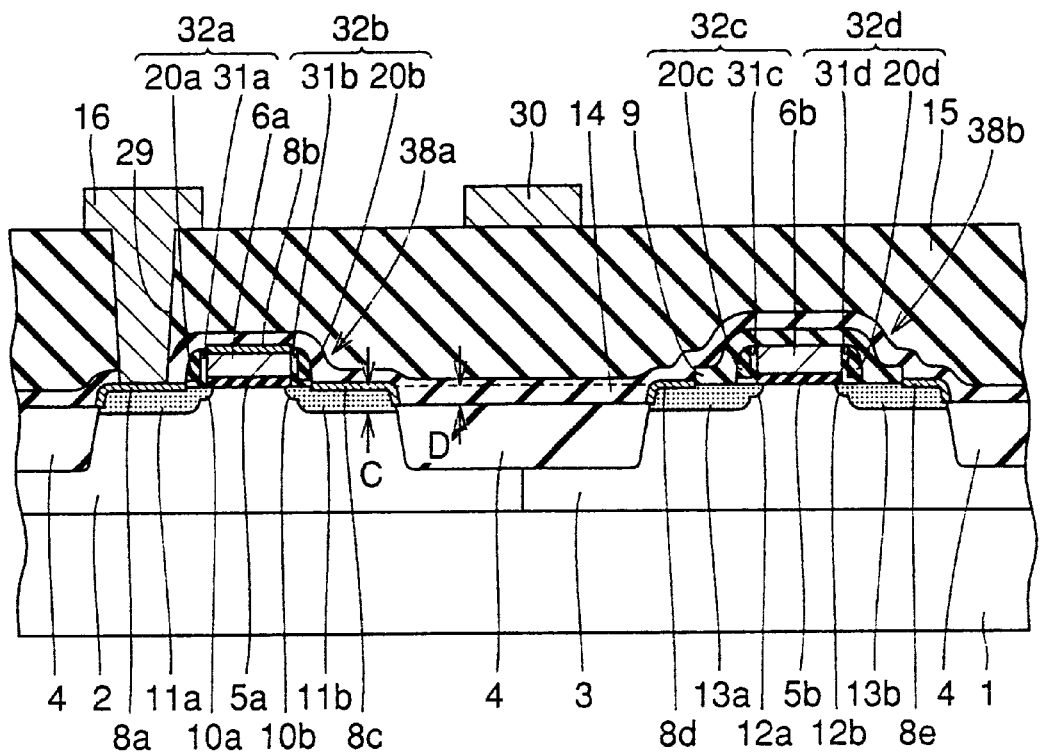
FIG. 1 is a schematic cross section showing a semiconductor device of a first embodiment of the invention.

Referring to FIG. 1, a semiconductor device will now be described.

Referring to FIG. 1, the semiconductor device includes field-effect transistors 38a and 38b formed at a main surface of a semiconductor substrate 1. An isolating oxide film 4 (i.e., an isolating and insulating film) is formed at the main surface of semiconductor substrate 1. Further, a p-well 2 and an n-well 3 are formed at the main surface of semiconductor substrate 1. Field-effect transistor 38a is provided with a gate electrode 6a, a gate insulating film 5a and source/drain regions 11a, 11b, 10a and 10b. Field-effect transistor 38b is provided with a gate electrode 6b, a gate insulating film 5b and source/drain regions 13a, 13b, 12a and 12b.

Semiconductor device 1 is provided at its main surface with source/drain regions formed of $n^-$-type impurity diffusion regions 10a and 10b, $n^+$-type impurity diffusion regions 11a and 11b, $p^-$-type impurity diffusion regions 12a and 12b, and $p^+$-type impurity diffusion regions 13a and 13b. Gate electrodes 6a and 6b are also formed on the main surface of semiconductor substrate 1 with gate insulating films 5a and 5b, respectively. Side wall films 32a–32d are formed on the side surfaces of gate electrodes 6a and 6b, respectively. Side wall films 32a–32d are formed of side wall film portions 31a–31d, which are formed of oxide films and serve as the lower layer side wall films, and side wall film portions 20a–20d, which are formed of nitride films and serve as upper layer side wall films, respectively. High-melting-point metal silicide layers 8a–8e are formed on n$^+$-type impurity diffusion regions 11a and 11b, p$^+$-type impurity diffusion regions 13a and 13b, and gate electrode 6a. A silicide protection film 9 made of a TEOS oxide film is formed on gate electrode 6b and p$^+$-type impurity diffusion regions 13a and 13b. An interlayer nitride film 14 is formed on silicide protection film 9, isolating oxide film 4 and field-effect transistor 38a. An interlayer insulating film 15 is formed on interlayer nitride film 14. In a region located above n$^+$-type impurity diffusion region 11a, an opening 29 is formed by partially removing interlayer nitride film 14 and interlayer insulating film 15 by etching. A metal electrode 16 is formed in opening 29 and on interlayer insulating film 15. An interconnection 30 is formed on interlayer insulating film 15.

As will be discussed later in connection with manufacturing steps, the upper surface of isolating oxide film 4 is subjected to over-etching in the manufacturing step of the semiconductor device, and thereby is removed by a film thickness D (total drop amount). However, this thickness D is smaller than a depth C (about 60 nm) of the region where n$^+$-type impurity diffusion regions 11a and 11b are formed. The upper surface of isolating oxide film 4 is located at a higher level than a junction boundary surface between p-well 2 (i.e., a first conductivity type region) and n$^+$-type impurity diffusion region 11b (i.e., a second conductivity type region). Therefore, high-melting-point metal silicide layers 8a and 8c are formed only on n$^+$-type impurity diffusion regions 11a and 11b, respectively, and do not extend to p-well 2. Therefore, such a problem does not occur that n$^+$-type impurity diffusion regions 11a and 11b are electrically connected to p-well 2 via high-melting-point metal silicide layers 8a and 8c, respectively. Consequently, it is possible to prevent disadvantageous increase in leak current which may flow between p-well 2 and n$^+$-type impurity diffusion regions 11a and 11b.

Referring to FIGS. 2 to 8, description will now be given on the method of manufacturing the semiconductor device.

Figure 2:
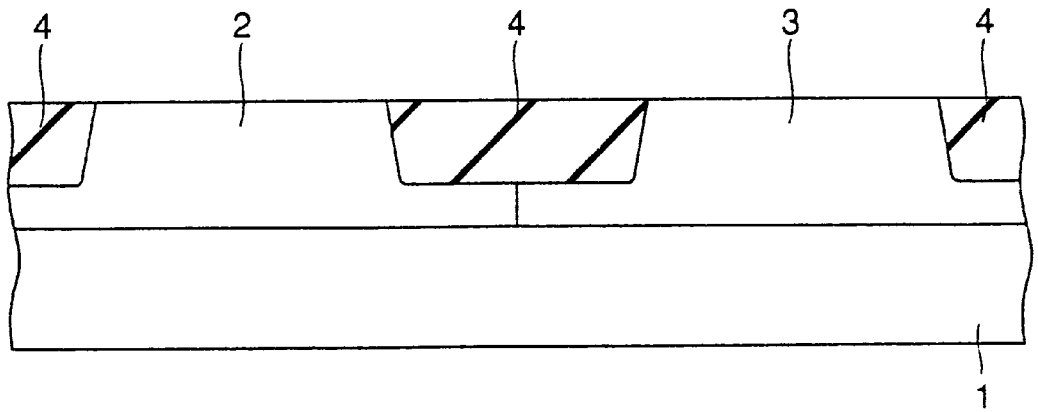
FIGS. 2 to 8 are schematic cross sections showing 1st to 7th steps in the method of manufacturing the semiconductor device shown in FIG. 1, respectively.

Referring to FIG. 2, a resist pattern (not shown) is formed on semiconductor substrate 1. Grooves are formed on semiconductor substrate 1 using this resist pattern as a mask. These grooves are filled with oxide films so that isolating oxide films 4 are formed. Then, p- and n-type impurities are implanted into semiconductor substrate 1 by an ion implanting method so that p- and n-wells 2 and 3 are formed. In this manner, the structure shown in FIG. 2 is formed.

Figure 3:
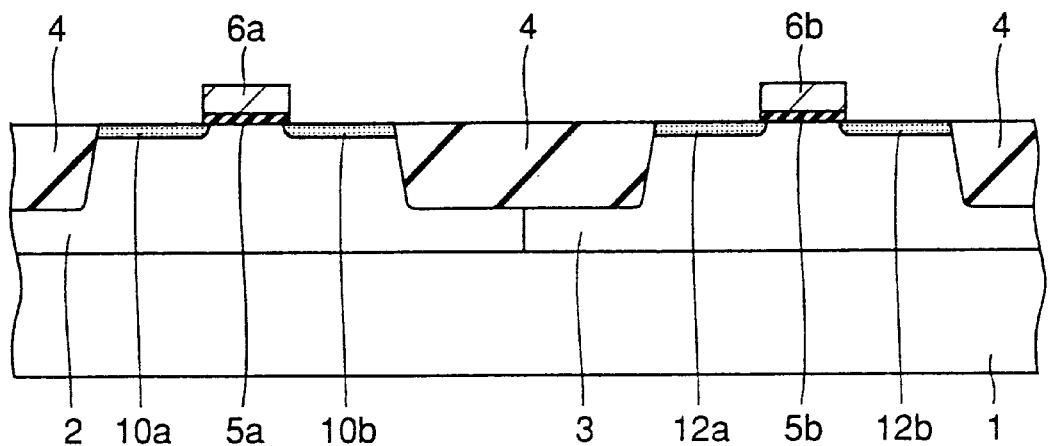

The surface of semiconductor substrate 1 is thermally oxidized to form an oxide film which will form gate oxide films 5a and 5b (see FIG. 3). This oxide film has a thickness of several nanometers. A polycrystalline silicon film (not shown) is formed on this oxide film. Then, a resist pattern (not shown) is formed on this polycrystalline silicon film. Using this resist pattern as a mask, the polycrystalline silicon film and the oxide film are partially removed so that gate electrodes 6a and 6b as well as gate insulating films 5a and 5b (see FIG. 3) are formed. Further, n$^-$-type impurity diffusion regions 10a and 10b (see FIG. 3) and p$^-$-type impurity diffusion regions 12a and 12b (see FIG. 3) are formed at the main surface of semiconductor substrate 1 by an ion implanting method. Consequently, the structure shown in FIG. 3 is obtained.

Figure 4:
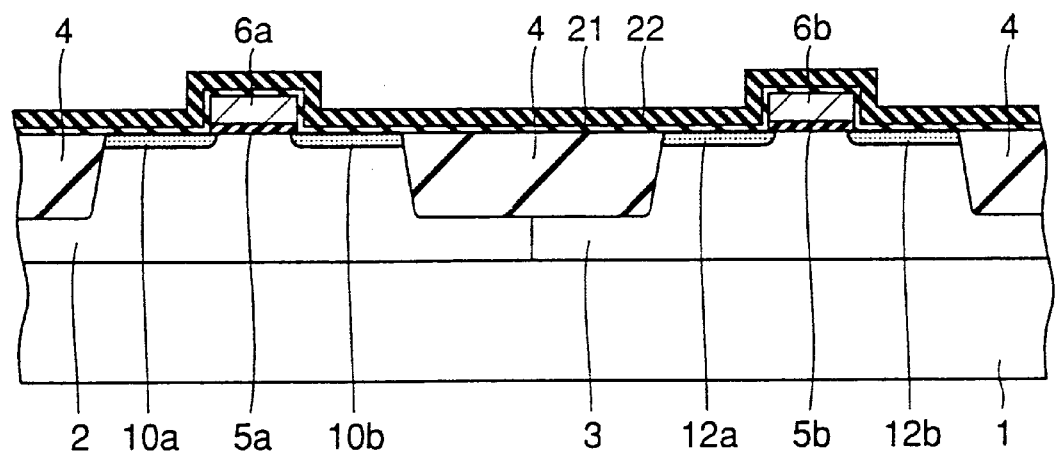

As shown in FIG. 4, a TEOS oxide film 21 is formed on gate electrodes 6a and 6b, semiconductor substrate 1 and isolating oxide films 4. TEOS oxide film 21 has a film thickness of about 10 nm. Then, a nitride film 22 is formed on TEOS oxide film 21. Nitride film 22 has a film thickness of about 50 nm.

Then, etchback is effected on the whole surface of nitride film 22 under the conditions which provide a high selectivity of the nitride film to the oxide film, and thereby side wall film portions 20a–20d (see FIG. 5) made of nitride films are formed on the side surfaces of gate electrodes 6a and 6b. In this process, over-etching of 40% is effected. However, the selectivity of the nitride film to the oxide film is high according to the above conditions. Therefore, oxide film 21 is removed only slightly by the etching before the etching stops. And thereby side wall film portions 31a–31d made of oxide films are formed. Then, etchback is effected on the whole surface of TEOS oxide film 21. In this case, the over-etching of about 40% is likewise executed so that the surface of isolating oxide film 4 is removed by a thickness A (i.e., removal thickness A and a drop amount). The removal thickness A in this case is about 4 nm, and is smaller than 5 nm at most because TEOS oxide film 21 has a thickness of about 10 nm.

By providing side wall films 32a–32d having the two-layer structure as described above, the removal thickness A of isolating oxide film 4, which is removed by the over-etching, can be smaller than that in the prior art.

Figure 5:
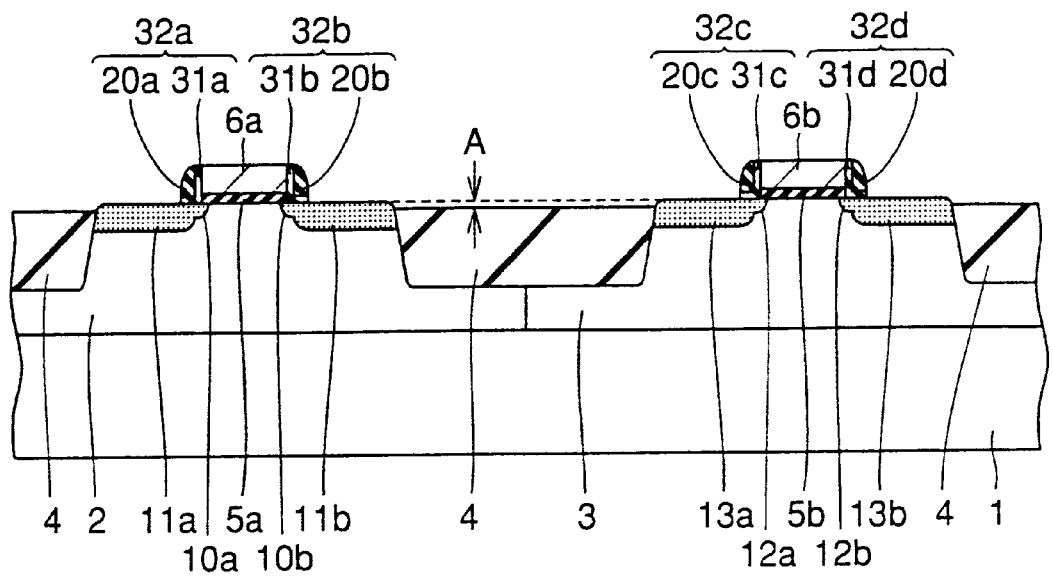

Then, n- and p-type impurities are implanted into the main surface of semiconductor substrate 1 by the ion implanting method. In this manner, n$^+$-type impurity diffusion regions 11a and 11b as well as p$^+$-type impurity diffusion regions 13a and 13b are formed. Consequently, a structure shown in FIG. 5 is obtained.

Figure 6:
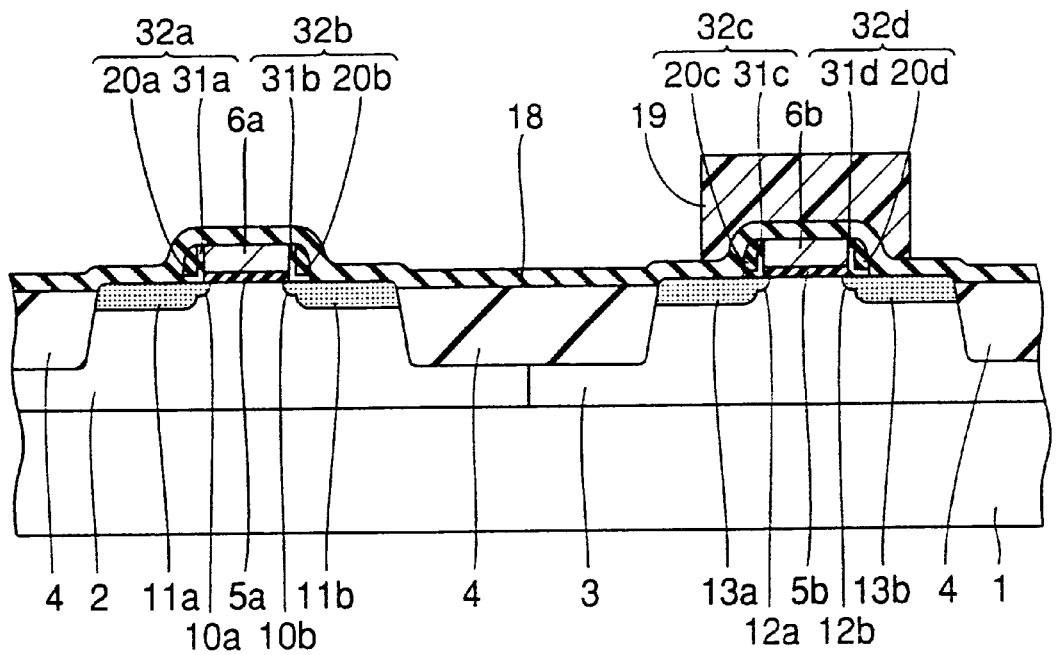

Then, as shown in FIG. 6, a TEOS oxide film 18 is deposited on the whole surface of semiconductor substrate 1. TEOS oxide film 18 has a film thickness of about 100 nm. A resist pattern 19 is formed on TEOS oxide film 18.

Figure 7:
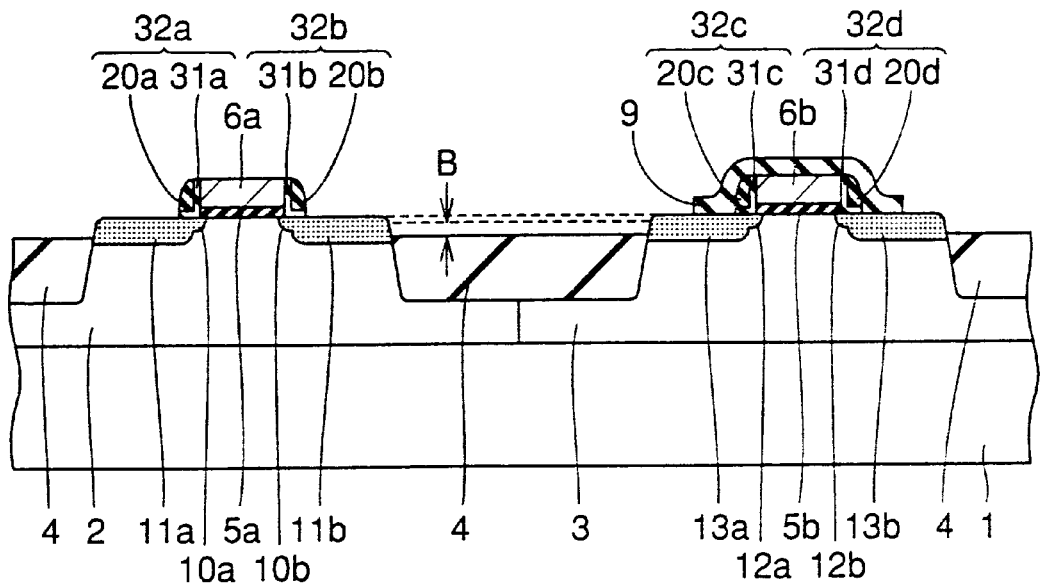

Using resist pattern 19 as a mask, TEOS oxide film 18 is removed by etching so that silicide protection film 9 is formed as shown in FIG. 7. This etching for forming silicide protection film 9 applies the over-etching of about 40%. As a result, the upper surface of isolating oxide film 4 is removed by a thickness B (i.e., removal thickness B and a drop amount). Removal thickness B is about 40 nm. Then, resist pattern 19 is removed. In this manner, a structure shown in FIG. 7 is obtained.

Figure 8:
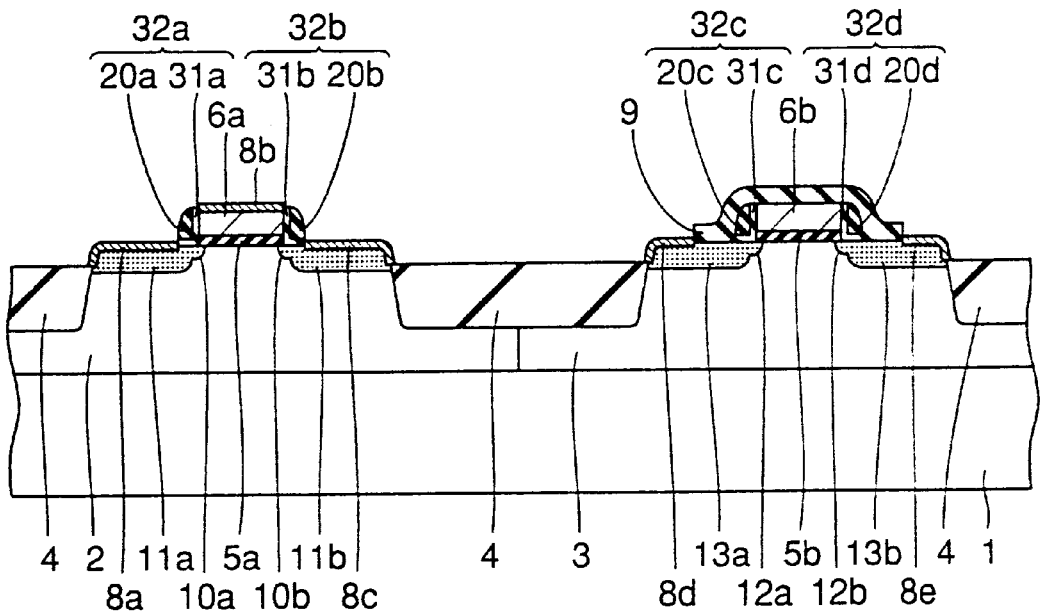

Then, a high-melting-point metal film is formed on the whole surface of semiconductor substrate 10 by a sputtering method. A heat treatment using a lamp annealing method is carried out so that a siliciding reaction occurs at portions where the silicon is in contact with the high-melting-point metal (i.e., the surfaces of n$^+$-type impurity diffusion regions 11a and 11b, the upper surface of gate electrode 6a and the surfaces of p$^+$-type impurity diffusion regions 13a and 13b). In this manner, high-melting-point metal silicide layers 8a–8e (see FIG. 8) are formed. Thereafter, unreacted high-melting-point metal is removed so that a structure shown in FIG. 8 is obtained.

In a subsequent etching step for forming opening 29 (see FIG. 1), interlayer nitride film 14 (see FIG. 1) for protecting isolating oxide film 4 is deposited on the whole surface of semiconductor substrate 1 (see FIG. 1). Interlayer oxide film 15 (see FIG. 1) is formed on interlayer nitride film 14. The upper surface of interlayer oxide film 15 is flattened by a CMP method. After forming a resist pattern on interlayer oxide film 15, interlayer oxide film 15 masked with this resist pattern is partially removed by etching. Opening 29 (see FIG. 1) is formed by this etching. This etching is performed with a high selectivity of interlayer oxide film 15 to the nitride film. Therefore, progress of etching once stops in interlayer nitride film 14. Thereafter, the etching conditions are changed, and etching is effected on interlayer nitride film 14 located at the bottom of opening 29. In this manner, opening 29 is formed. Thereafter, metal electrode 16 and interconnection 30 are formed so that the semiconductor device shown in FIG. 1 is obtained.

A distance C (depth C) (see FIG. 1) of about 60 nm is kept from the main surface of semiconductor substrate 1 to the bottom surface of the region provided with $n^+$-type impurity diffusion regions 11a and 11b as well as $p^+$-type impurity diffusion regions 13a and 13b. Therefore, the upper surface of isolating oxide film 4 can be over-etched to reduce its thickness by up to 60 nm. In the semiconductor device according to the invention, however, removal thickness A which is reduced for forming side wall films 32a–32d is about 4 nm as shown in FIGS. 5 and 7. Also, removal thickness B of isolating oxide film 4 which is reduced for forming silicide protection film 9 is about 40 nm. Consequently, the total drop amount of isolating oxide film 4 (the thickness D) in the semiconductor device according to the invention is equal to about 44 nm as shown in a table 1. Therefore, it is possible to prevent effectively such a situation that high-melting-point silicide metal layers 8a, 8c, 8d and 8e extend from $n^+$-type impurity diffusion regions 11a and 11b as well as $p^+$-type impurity diffusion regions 13a and 13b to p-well 2 and n-well 3. Accordingly, increase in leak current can be prevented. The table 1 shows data relating to the drop amounts of the isolating oxide films as well as the film quantities and thicknesses of films forming the side wall films in the semiconductor devices in the first to sixth embodiments of the invention as well as the prior art.

Figure 9:
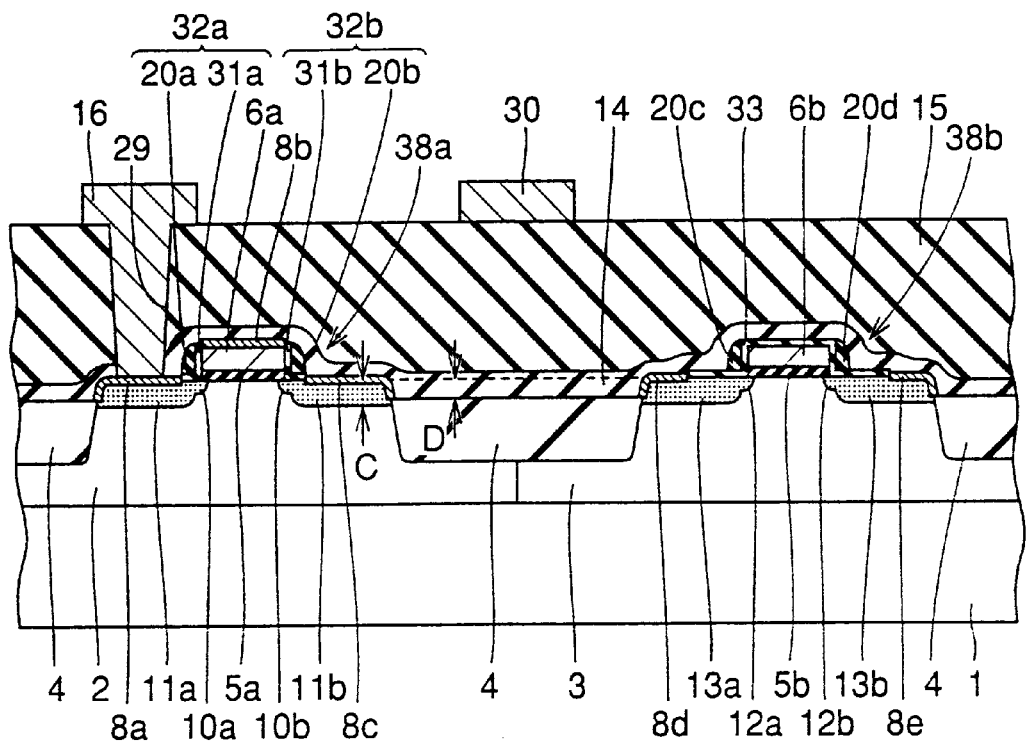
FIG. 9 is a schematic cross section showing a semiconductor device of a second embodiment of the invention.

The semiconductor device shown in FIG. 9 has a structure which is basically similar to that of the first embodiment of the invention shown in FIG. 1. In the semiconductor device shown in FIG. 9, however, side wall film portions 31c and 31d (see FIG. 1) formed of oxide films and serving as the lower layer side wall films of field-effect transistor 38b are replaced with a silicide protection film 33, which extends over the upper surface of gate electrode 6b and $p^+$-type impurity diffusion regions 13a and 13b. Thus, silicide protection film 33 also has a function as side wall film portions 31c and 31d. Therefore, the steps required for manufacturing the semiconductor device can be reduced in number, as described below in connection with the manufacturing method.

Figure 10:
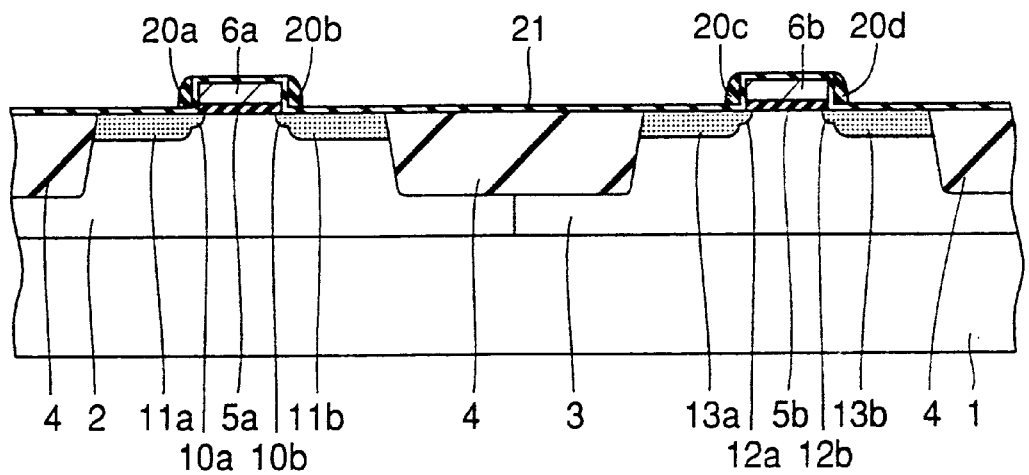
FIGS. 10 to 12 are schematic cross sections showing 1st to 3rd steps in the method of manufacturing the semiconductor device shown in FIG. 9, respectively.
Figure 11:
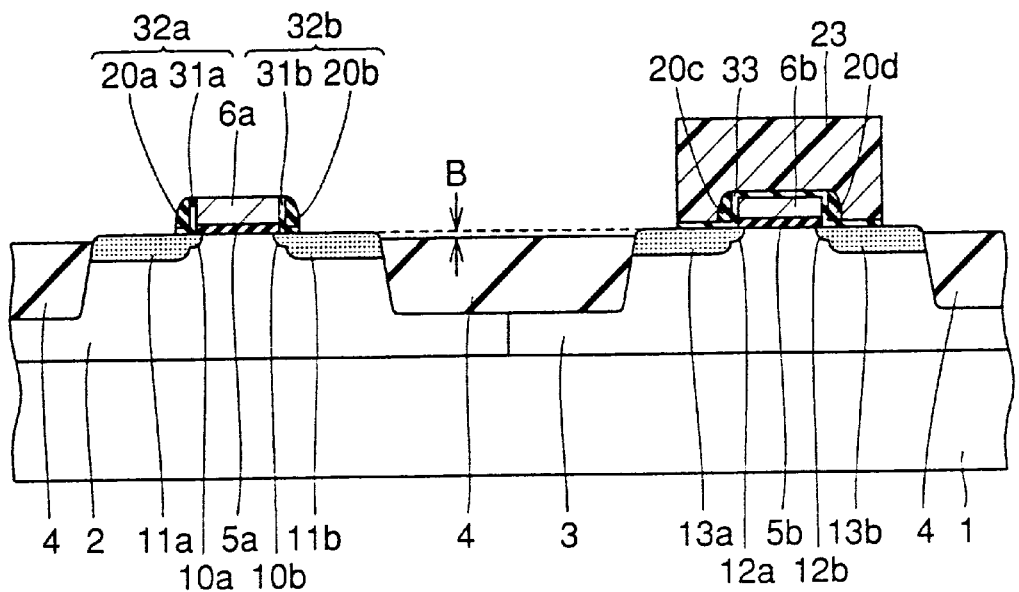
Figure 12:
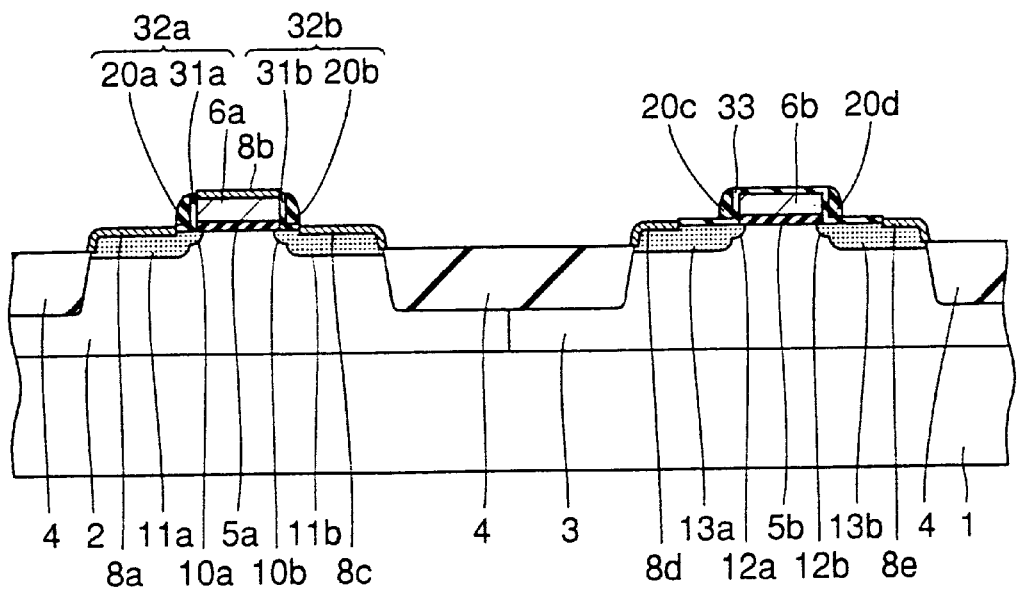

Referring to FIGS. 10 to 12, the method of manufacturing the semiconductor device will now be described.

First, steps are executed in the same manner as the manufacturing steps in the method of manufacturing the semiconductor device according to the first embodiment of the invention shown in FIGS. 2 to 4. However, TEOS oxide film 21 (see FIG. 10) has a thickness of about 30 nm, and nitride film 22 (see FIG. 4) formed on TEOS oxide film 21 has a thickness of about 30 nm as shown in the table 1. Etchback is effected on the whole surface of nitride film 22 under the etching conditions providing a high selectivity of the nitride film to the oxide film. As a result, side wall film portions 20a–20d (see FIG. 10) made of nitride films are formed on side surfaces of gate electrodes 6a and 6b, respectively. Then, the ion implanting method is executed to implant n- and p-type impurities into predetermined positions of the main surface of semiconductor substrate 1. Thereby, $n^+$-type impurity diffusion regions 11a and 11b as well as p -type impurity diffusion regions 13a and 13b are formed as shown in FIG. 10. In this manner, the structure shown in FIG. 10 is obtained.

Then, a resist pattern 23 (see FIG. 11) is formed on a region located above gate electrode 6b. Using resist pattern 23 as a mask, TEOS oxide film 21 is partially removed. Thereby, the structure shown in FIG. 11 is obtained.

This etching for removing TEOS oxide film 21 causes over-etching of about 40% so that the upper surface of

TABLE 1

| | side wall film structure | silicide protection film structure | surface drop amount of isolating oxide film when forming side wall film (A) | surface drop amount of isolating oxide film when forming silicide protection film (B) | total drop amount (D = A + B) |
|---|---|---|---|---|---|
| prior art | TEOS 60 nm | TEOS 100 nm | 25 nm | 40 nm | 65 nm |
| Embodiment 1 | Nitride Film 50 nm /TEOS 10 nm | TEOS 100 nm | 4 nm | 40 nm | 44 nm |
| Embodiment 2 | Nitride Film 30 nm /TEOS 30 nm | | 0 nm | 12 nm | 12 nm |
| Embodiment 3 | Nitride Film 50 nm /TEOS 10 nm | | 0 nm | 4 nm | 4 nm |
| Embodiments 4 & 5 | Nitride Film 50 nm /TEOS 10 nm | | 0 nm | 0 nm | 0 nm |
| Embodiment 6 | Nitride Film 50 nm /TEOS 10 nm | TEOS 100 nm | 4 nm | 0 nm | 4 nm |

(Second Embodiment)

Referring to FIG. 9, description will now be given on a semiconductor device.

isolating oxide film 4 is removed by thickness B. As shown in the table 1, thickness B of the removed portion is about 12 nm.

After this etching, silicide protection film 33 remains on the upper surface of gate electrode 6b and p$^+$-type impurity diffusion regions 13a and 13b.

Then, resist pattern 23 is removed. By the manner similar to that already described in connection with the first embodiment, high-melting-point metal silicide layers 8a–8e are formed on gate electrode 6a, n$^+$-type impurity diffusion regions 11a and 11b, and p$^+$-type impurity diffusion regions 13a and 13b. In this manner, a structure shown in FIG. 12 is obtained.

Since the structure described above is provided with silicide protection film 33 which is made of the oxide film and serves also as the side wall film portions. As shown in the table 1, therefore, isolating oxide film 4 is subjected only one time to the etching applied to its surface. The removal thickness B of the surface portion of isolating oxide film 4 can be equal to 12 nm and thus can be remarkably small. Therefore, it is possible to prevent reliably formation of high-melting-point metal silicide layers 8a and 8c–8e extending from n$^+$-type impurity diffusion regions 11a and 11b as well as p$^+$-type impurity diffusion regions 13a and 13b to p- and n-wells 2 and 3. Consequently, increase in leak current in the semiconductor device can be reliably prevented.

The manufacturing steps of the semiconductor device can be simplified as compared with the case where the silicide protection film is independent of side wall film portions made of the oxide film. Consequently, the steps required for manufacturing the semiconductor device can be reduced in number so that the manufacturing cost of the semiconductor device can be reduced.

(Third Embodiment)

Figure 13:
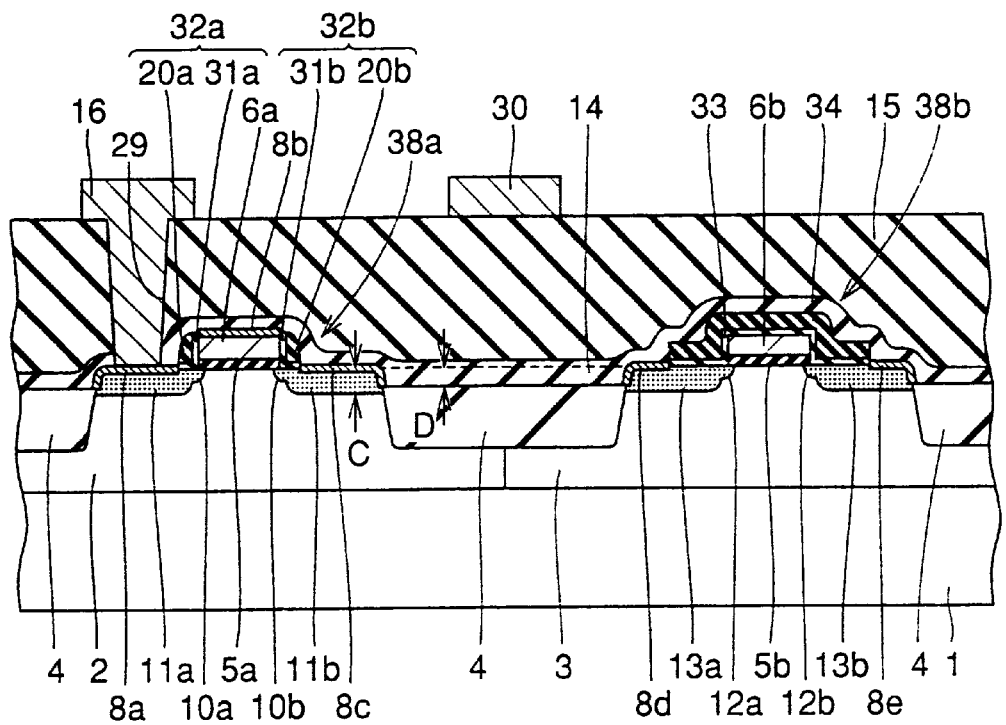
FIG. 13 is a schematic cross section showing a semiconductor device of a third embodiment of the invention.

Referring to FIG. 13, description will now be given on a semiconductor device.

The semiconductor device shown in FIG. 13 has a structure basically similar to that of the semiconductor device shown in FIG. 1. In the semiconductor device shown in FIG. 13 and particularly in field-effect transistor 38b, however, TEOS oxide film 21 and nitride film 22 (see FIG. 4), which are deposited for the purpose of forming side wall films 32c and 32d (see FIG. 1) in the first embodiment, are utilized as silicide protection films 33 and 34. As can be understood from the manufacturing method which will be described later, the thickness of TEOS oxide film 21 (see FIG. 14) formed on isolating oxide film 4 can be smaller than that in the second embodiment of the invention. Thereby, it is possible to reduce further the thickness of the portion of isolating oxide film 4, which is removed by the over-etching in the process of removing TEOS oxide film 21. Consequently, the upper surface of isolating oxide film 4 can be reliably positioned at a higher level than the junction boundary surfaces between p-well 2 and n$^+$-type impurity diffusion regions 11a and 11b. Therefore, it is possible to prevent reliably formation of high-melting-point metal silicide layers 8a and 8c–8e extending from n$^+$-type impurity diffusion regions 11a and 11b as well as p$^+$-type impurity diffusion regions 13a and 13b to p- and n-wells 2 and 3. Consequently, increase in leak current in the semiconductor device can be reliably prevented.

Figure 14:
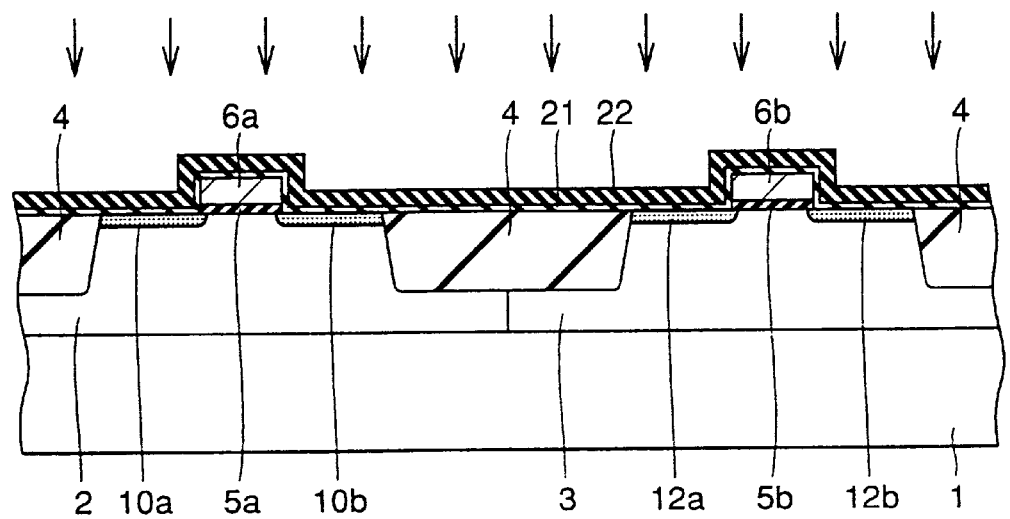
FIGS. 14 to 16 are schematic cross sections showing 1st to 3rd steps in the method of manufacturing the semiconductor device shown in FIG. 13, respectively.
Figure 15:
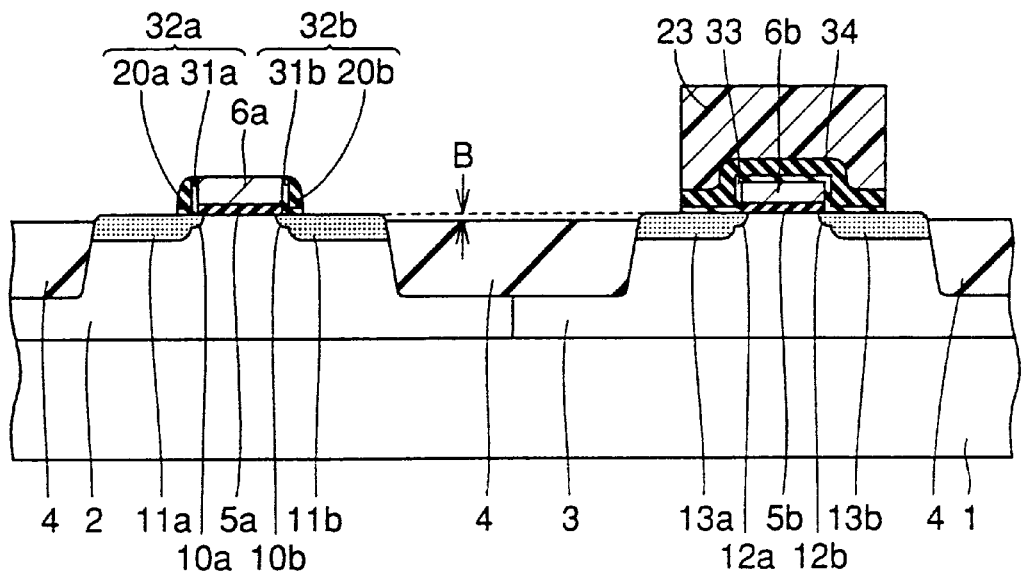
Figure 16:
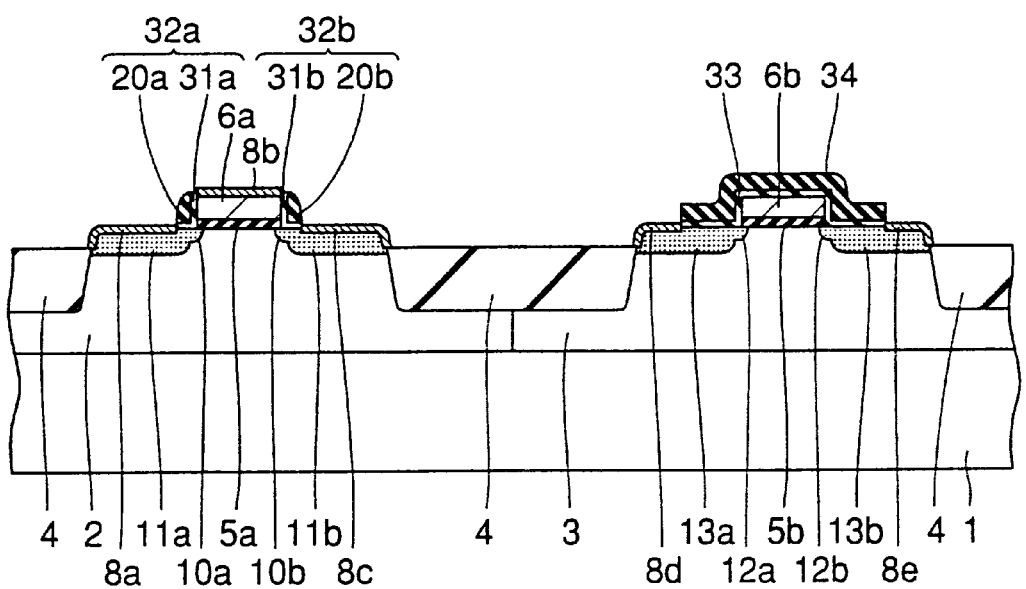

Referring to FIGS. 14 to 16, the method of manufacturing the semiconductor device will now be described.

First, steps are executed in the same manner as the manufacturing steps in the method of manufacturing the semiconductor device according to the first embodiment of the invention shown in FIGS. 2 to 4. However, TEOS oxide film 21 has a thickness of about 10 nm, and nitride film 22 has a thickness of about 50 nm as shown in the table 1. As shown in FIG. 14, ions of n- and p-type impurities are implanted into predetermined regions of semiconductor substrate 1 to form n$^+$-type impurity diffusion regions 11a and 11b (see FIG. 15), and p$^+$-type impurity diffusion regions 13a and 13b (see FIG. 15).

Then, resist pattern 23 (see FIG. 15) is formed on nitride film 22 for forming silicide protection films 33 and 34 on field-effect transistor 38b (see FIG. 13). Then, nitride film 22 masked with resist pattern 23 is etched under conditions providing a high selectivity of the nitride film to the oxide film, and thereby is partially removed. In this processing, side wall film portions 20a and 20b made of nitride films are formed on the side surfaces of gate electrode 6a, respectively. The etching conditions are then changed, and TEOS oxide film 21 masked with resist pattern 23 is partially removed. In this manner, the structure shown in FIG. 15 is obtained.

In the etching process for removing TEOS oxide film 21, over-etching of about 40% is executed, as is done in the first and second embodiments. Therefore, the upper surface of isolating oxide film 4 is over-etched and removed by thickness B. As shown in the table 1, thickness B of the portion thus removed is about 4 nm.

Then, resist pattern 23 is removed. In the same manner as that in the semiconductor device manufacturing method of the first embodiment of the invention, high-melting-point metal silicide layers 8a–8e can be formed as shown in FIG. 16.

Then, the semiconductor device manufacturing steps according to the first embodiment of the invention are executed so that the semiconductor device shown in FIG. 13 can be obtained.

As described above, silicide protection film 33 formed of a remained portion of TEOS oxide film 21 and silicide protection film 34 formed of a remained portion of nitride film 22 are used as the silicide protection films. Therefore, the thickness of TEOS oxide film 21 can be smaller than that of TEOS oxide film 21 of the second embodiment of the invention. Accordingly, in the etching step for removing the TEOS oxide film, thickness B of the portion of isolating oxide film 4 removed by the over-etching can be smaller than that of the removed portion of isolating oxide film 4 according to the second embodiment of the invention. Consequently, it is possible to prevent more reliably formation of high-melting-point metal silicide layers 8a and 8c–8e extending from n$^+$-type impurity diffusion regions 11a and 11b as well as p$^+$-type impurity diffusion regions 13a and 13b to p- and n-wells 2 and 3. Consequently, increase in leak current can be reliably prevented in the semiconductor device.

Since the step of forming side wall films 32a and 32b can be executed at the same time as the step of forming silicide protection films 33 and 34, the manufacturing steps of the semiconductor device can be simplified.

(Fourth embodiment)

Figure 17:
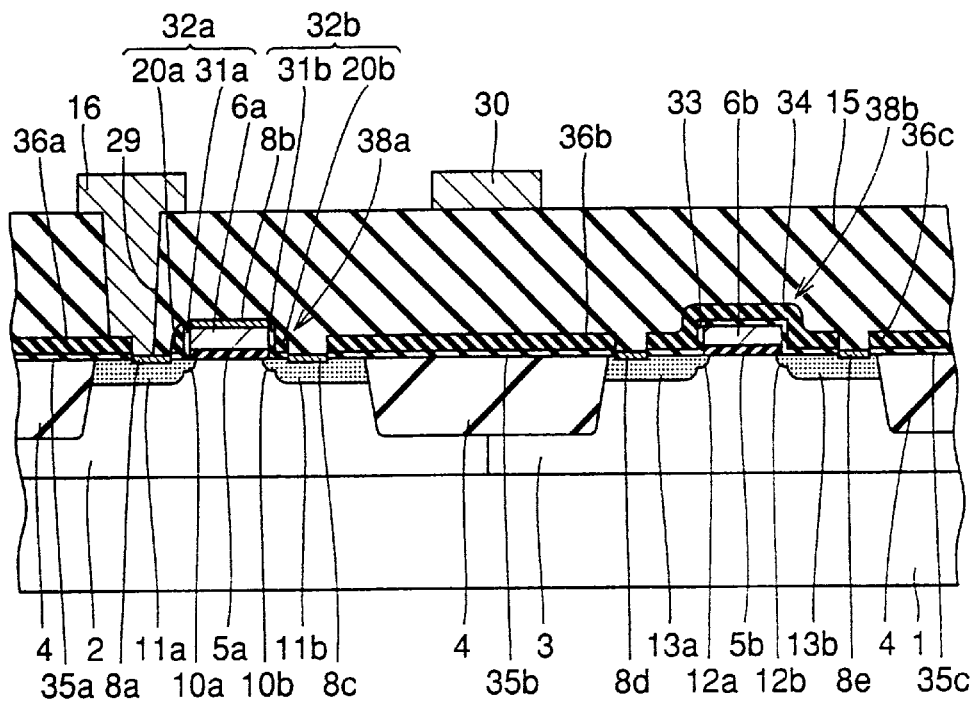
FIG. 17 is a schematic cross section showing a semiconductor device of a fourth embodiment of the invention.

Referring to FIG. 17, a semiconductor device has a structure basically similar to that of the semiconductor device shown in FIG. 13. In the semiconductor device shown in FIG. 17, however, TEOS oxide film 21 (see FIG. 14) and nitride film 22 (see FIG. 14) remain also on isolating oxide films 4, whereby isolating oxide film protection films 35a–35c and 36a–36c (i.e., coating films) are formed. Since isolating oxide film protection films 35a–35c and 36a–36c are formed as described above, it is possible to prevent removal of the upper surface of isolating oxide film 4 due to etching in the manufacturing method, which will be described later. Therefore, such a situation can be reliably prevented that the upper surface of isolating oxide film 4 is position at a lower level than the main surface of semiconductor substrate 1. Consequently, effects similar to those of the first embodiment of the invention can be achieved.

Since silicide protection films 36a–36c made of nitride films are formed on isolating oxide films 4, it is not necessary to form interlayer nitride film 14 (see FIG. 13) in contrast to the first to third embodiments of the invention. Therefore, the steps required for manufacturing the semiconductor device can be reduced in number. It is not necessary to change the etching conditions for forming opening 29 during the process in contrast to the first to third embodiments of the invention, and the conventional etching conditions can be used as they are.

Figure 18:
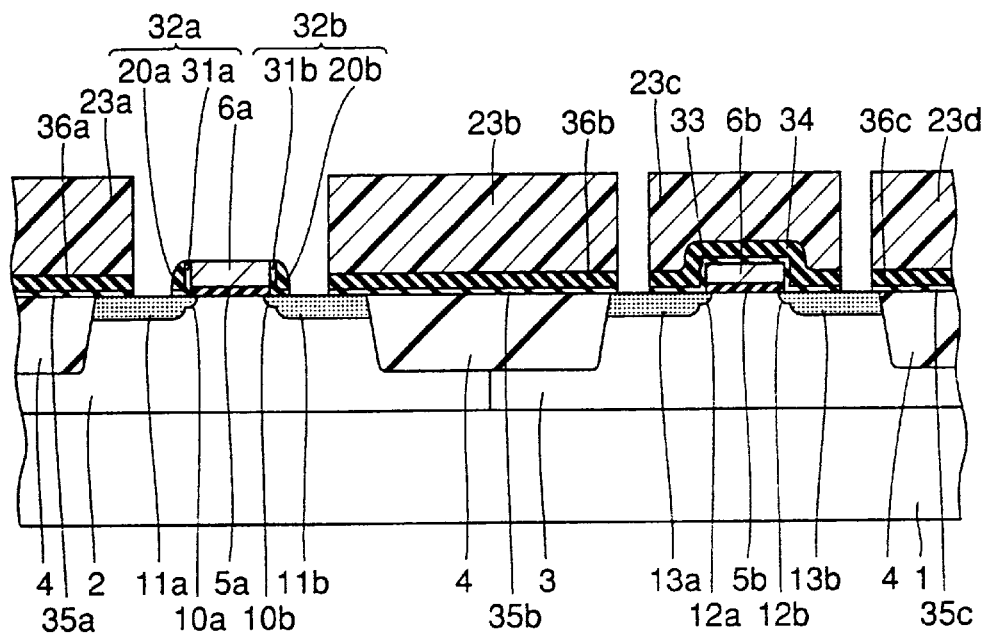
FIGS. 18 and 19 are schematic cross sections showing 1st and 2nd steps in the method of manufacturing the semiconductor device shown in FIG. 17, respectively.
Figure 19:
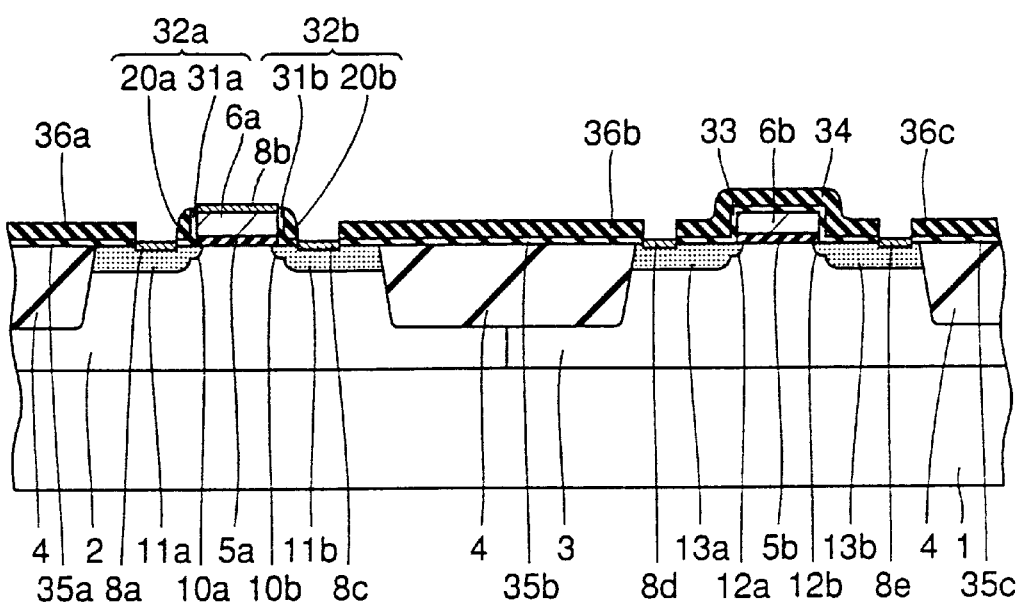

The method of manufacturing the semiconductor device will now be described below with reference to FIGS. 18 and 19.

First, steps are executed in the same manner as the manufacturing steps of the semiconductor device shown in FIGS. 2 to 4 and FIG. 14. TEOS oxide film 21 (see FIG. 14) has a thickness of about 10 nm, and nitride film 22 (see FIG. 14) has a thickness of about 50 nm as shown in the table 1. Resist patterns 23a–23d (see FIG. 18) are formed on nitride film 22. Using resist patterns 23a–23d as a mask, etching is effected to remove nitride film 22 under the conditions providing a high selectivity of the nitride film to the oxide film. In this processing, side wall film portions 20a and 20b are formed on side surfaces of gate electrode 6a, respectively. Then, the etching conditions are changed, and the etching is effected to remove partially TEOS oxide film 21. As a result, a structure shown in FIG. 18 is obtained.

In the structure thus formed, isolating oxide film protection films 35a–35c and 36a–36c are formed on isolating oxide films 4. Therefore, the upper surface of isolating oxide film 4 can be prevented from being partially removed in the etching step for forming side wall films 32a and 32b as well as silicide protection films 33 and 34. Thus, in the fourth embodiment of the invention, the upper surface of isolating oxide film 4 is not removed by the over-etching, as can be seen from the table 1.

As described above, silicide protection films 33 and 34 as well as side wall films 32a and 32b can be formed at the same time so that the steps required for manufacturing the semiconductor device can be reduced in number.

Figure 20:
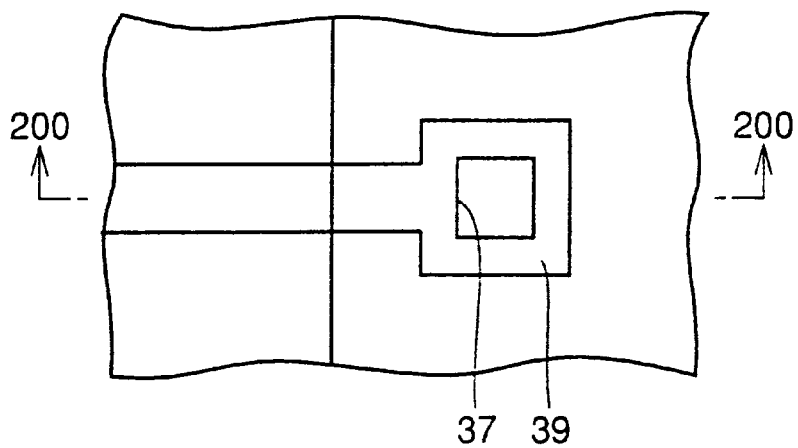
FIG. 20 is a schematic plan showing a gate contact portion in a semiconductor device shown in FIG. 18.
Figure 21:
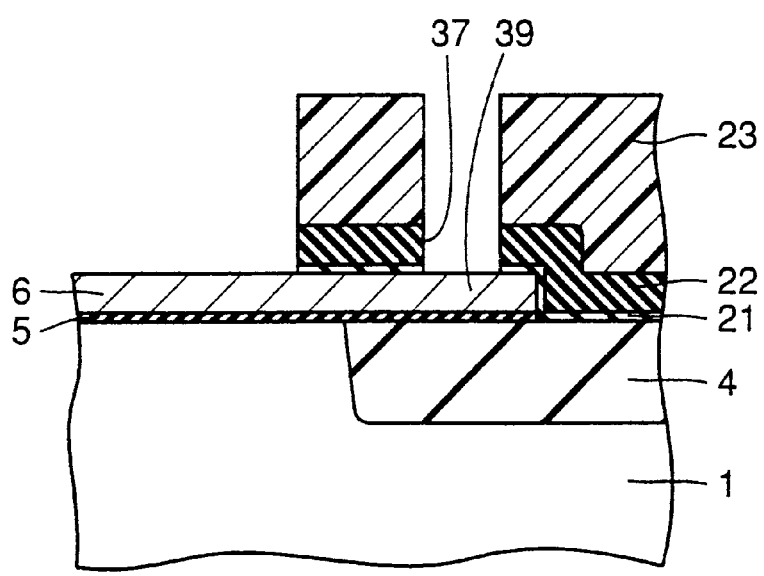
FIG. 21 is a schematic cross section taken along line 200—200 in FIG. 20.

When forming resist patterns 23a–23d, resist pattern 23 is essentially formed in regions where isolating oxide film 4 is formed but a gate contact portion 39 is not formed, as shown in FIGS. 20 and 21. FIGS. 20 and 21 show the manufacturing step of the semiconductor device shown in FIG. 18, and particularly the state of the region where the gate contact portion is formed.

Then, resist patterns 23a–23d are removed. High-melting-point metal silicide layers 8a–8e are formed in a manner similar to that of the first to third embodiments of the invention. Then, interlayer oxide film 15 (see FIG. 17) is formed over the entire surface of semiconductor substrate 1. The upper surface of interlayer oxide film 15 is flattened by a CMP method. Thereafter, a resist pattern is formed on interlayer oxide film 15. Etching is effected on interlayer oxide film 15 masked with this resist pattern so that opening 29 (see FIG. 17) is formed. In the process, isolating oxide films 36a–36c made of nitride films are formed on isolating oxide films 4. Therefore, it is possible to prevent reliably such a problem that isolating oxide film 4 is partially removed by the etching effected for forming opening 29. Accordingly, it is not necessary to form interlayer nitride film 14 (see FIG. 13) in contrast to the first to third embodiments of the invention. Consequently, the steps required for manufacturing the semiconductor device can be further reduced in number.

Metal electrode 16 is formed in opening 29 and on interlayer oxide film 15. Interconnection 30 is formed on interlayer oxide film 15. In this manner, the semiconductor device shown in FIG. 17 can be obtained. Since the opening 29 can be formed by only one etching step, the etching for forming opening 29 can be performed under the same etching conditions as those in the prior art.

(Fifth Embodiment)

Figure 22:
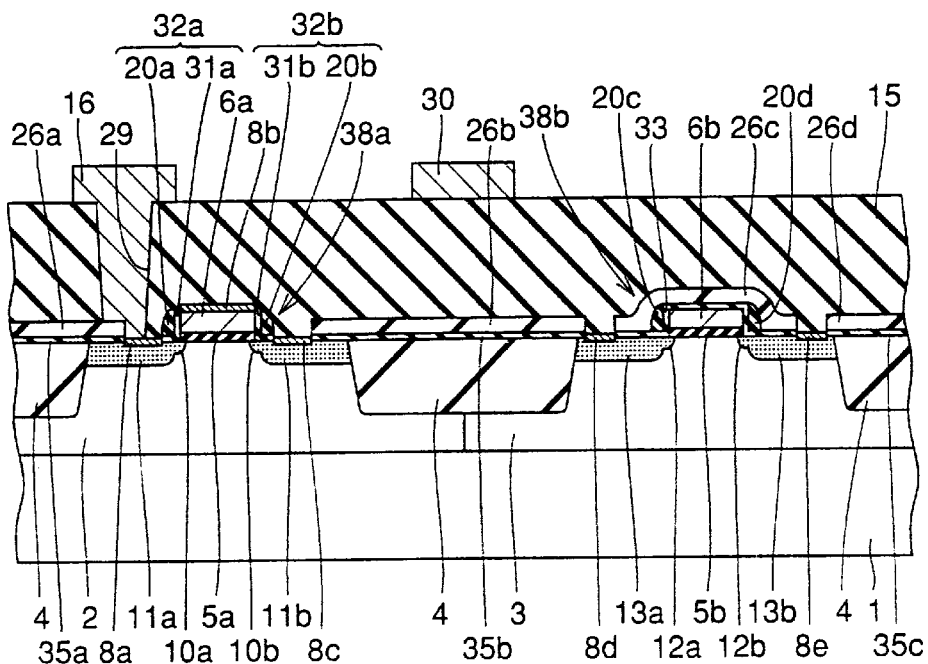
FIG. 22 is a schematic cross section showing a semiconductor device of a fifth embodiment of the invention.

Referring to FIG. 22, a semiconductor device will now be described.

The semiconductor device shown in FIG. 22 has the basically same structure as that shown in FIG. 17. However, the semiconductor device shown in FIG. 22 is provided with side wall film portions 20c and 20d, which are made of nitride films and are formed on the side surfaces of gate electrode 6b of field-effect transistor 38b, respectively.

Therefore, profiles of $n^+$-type impurity diffusion regions 11a and 11b as well as $p^+$-type impurity diffusion regions 13a and 13b can be controlled more accurately when forming these regions, as can be understood from the manufacturing steps which will be described later. Accordingly, the profiles of $n^+$-type impurity diffusion regions 11a and 11b as well as $p^+$-type impurity diffusion regions 13a and 13b can be steep at the vicinities of the opposite ends of gate electrodes 6a and 6b. Consequently, field-effect transistors 38a and 38b can have an improved resistance against punch-through.

Figure 23:
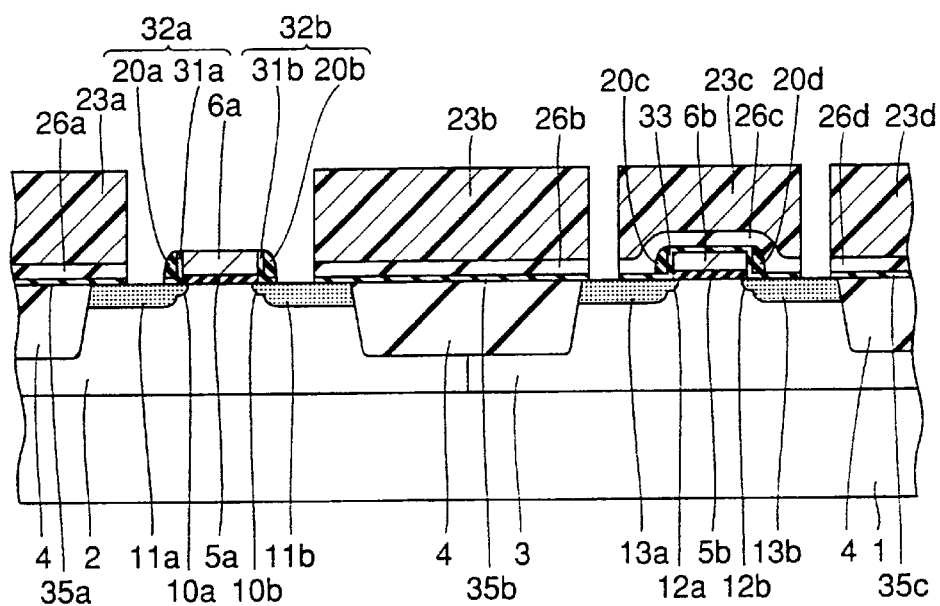
FIGS. 23 and 24 are schematic cross sections showing 1st and 2nd steps in the method of manufacturing the semiconductor device shown in FIG. 22, respectively.
Figure 24:
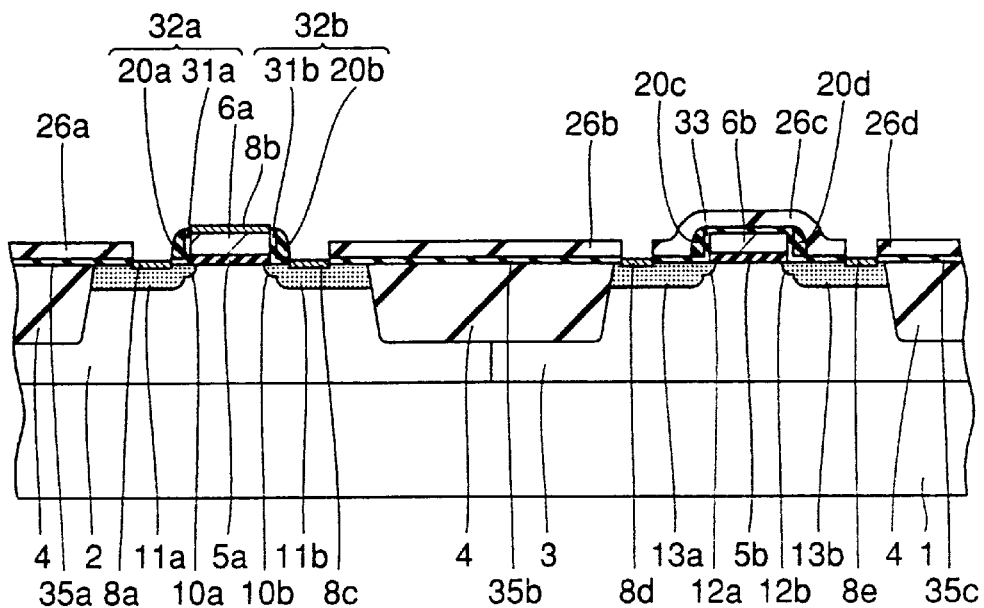

Referring to FIGS. 23 and 24, the method of manufacturing the semiconductor device will now be described.

First, steps which are the same as the manufacturing steps of the semiconductor device shown in FIGS. 2–4 and FIG. 10 are executed. As shown in the table 1, TEOS oxide film 21 (see FIG. 10) has the thickness of about 10 nm, and nitride film 22 (see FIG. 4) which will form side wall film portions 20a–20d (see FIG. 23) have a thickness of about 50 nm. In the structure provided with side wall film portions 20a–20d thus formed, the ion implanting method is executed to implant n- and p-type impurities into the main surface of semiconductor substrate 1. In this manner, $n^+$-type impurity diffusion regions 11a and 11b (see FIG. 23) as well as $p^+$-type impurity diffusion regions 13a and 13b (see FIG. 23) are formed.

When the ion implantation is performed for forming $n^+$-type impurity diffusion regions 11a and 11b as well as $p^+$-type impurity diffusion regions 13a and 13b, the structure is in such a state that only TEOS oxide film 21 (see FIG. 10) is formed on the main surface of semiconductor substrate 1 and gate electrodes 6a and 6b. Therefore, the profiles of $n^+$-type impurity diffusion regions 11a and 11b as well as $p^+$-type impurity diffusion regions 13a and 13b, which are formed by impurity implantation, can be controlled accurately as compared with third and fourth embodiments of the invention. As a result, the punch-through resistances of field-effect transistors 38a and 38b can be improved by adjusting the profiles of the impurity diffusion regions at the ends of gate electrodes 6a and 6b.

During the above impurity implantation, only TEOS oxide film 21 is present on gate electrodes 6a and 6b so that the implantation energy required for implanting the impurities into gate electrodes 6a and 6b can be lower than that in the semiconductor device manufacturing method of the third and fourth embodiments of the invention. More specifically, the ion implantation requires a relatively high energy in the case where ions are implanted into gate electrodes 6a and 6b through nitride film 22 and TEOS oxide film 21 as is done in the third and fourth embodiments of the invention. In this case, the impurities implanted into gate electrodes 6a and 6b are distributed over relatively wide ranges. The impurities thus implanted may be distributed through gate insulating films 5a and 5b into the underlying channel regions in semiconductor substrate 1. This deteriorates electric characteristics of field-effect transistors 38a and 38b. For the purpose of preventing such deterioration of electric characteristics, gate electrodes 6a and 6b must have thicknesses which are increased to a certain extent for preventing arrival of the impurity to semiconductor substrate 1.

However, in the semiconductor device according to the fifth embodiment of the invention shown in FIG. 22, the impurities to be implanted into gate electrodes 6a and 6b must pass only through TEOS oxide film 21 as described before. Therefore, the energy required for the impurity implantation can be relatively low. Accordingly, the distribution of impurities in the depth direction is smaller than those in the third and fourth embodiments of the invention. Consequently, the thicknesses of gate electrodes 6a and 6b can be reduced. Thereby, the flatness of the upper surface of isolating oxide film 15 (see FIG. 22) can be further improved.

Since the impurities are implanted after side wall film portions 20a–20d are formed, the profiles of $n^+$-type impurity diffusion regions 11a and 11b as well as $p^+$-type impurity diffusion regions 13a and 13b can be controlled accurately.

After forming $n^+$-type impurity diffusion regions 11a and 11b as well as $p^+$-type impurity diffusion regions 13a and 13b as described above, a nitride film (not shown) is deposited on the whole surface of semiconductor substrate 1. Resist patterns 23a–23d (see FIG. 23) are formed on the nitride film. Resist patterns 23a–23d are necessarily formed over the regions provided with isolating oxide films 4 other than the gate contact portions, similarly to the fourth embodiment of the invention. Then, using resist patterns 23a–23d as a mask, the above nitride film is partially removed by the etching under the etching conditions providing a high selectivity of the nitride film to the oxide film. Then, the etching conditions are changed, and oxide film 21 is removed. Consequently, isolating oxide films 26a, 26b, 26d and 35a–35c as well as silicide protection films 33 and 26c are formed as shown in FIG. 23. Since isolating oxide film protection films 26a, 26b, 26d and 35a–35c are formed on isolating oxide films 4, effects similar to those of the fourth embodiment of the invention can be achieved.

Then, resist patterns 23a–23d are removed. Then, steps similar to those of the first embodiment of the invention are executed so that high-melting-point metal silicide layers 8a–8e are formed as shown in FIG. 24. Thereafter, steps similar to those of the fourth embodiment of the invention are executed so that the semiconductor device shown in FIG. 22 is obtained.

The data such as thicknesses of the nitride film and the TEOS oxide film, and the removal thickness (drop amount) of isolating oxide film 4 are shown in the table 1.
(Embodiment 6)

Figure 25:
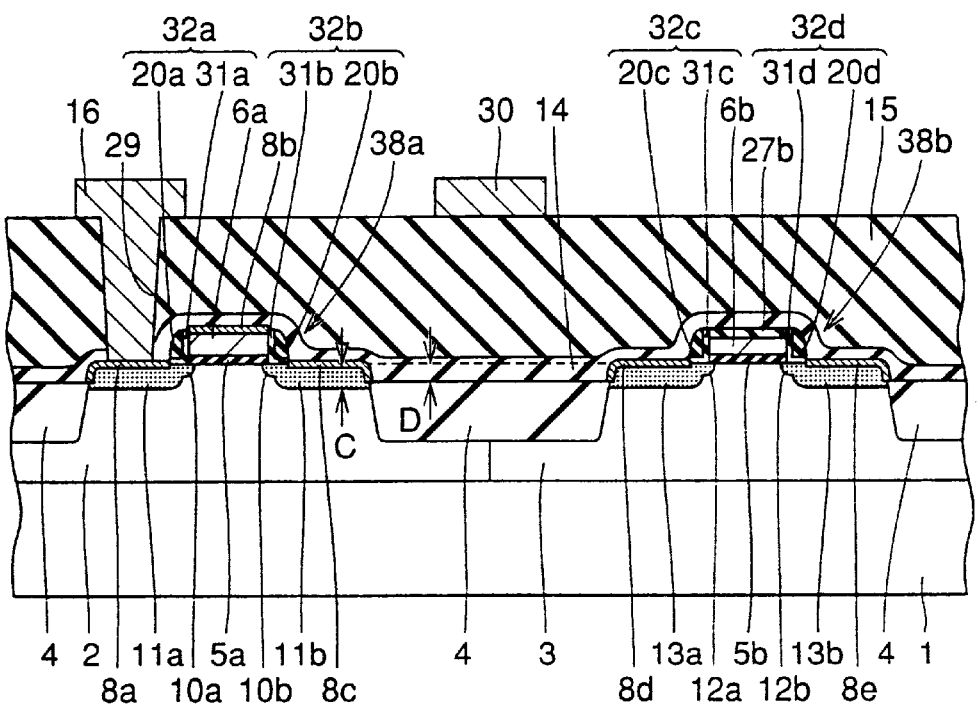
FIG. 25 is a schematic cross section showing a semiconductor device of a sixth embodiment of the invention.

Referring to FIG. 25, a semiconductor device will now be described.

The semiconductor device shown in FIG. 25 has a structure which is basically similar to that of the semiconductor device shown in FIG. 1. In the semiconductor device shown in FIG. 25, however, a TEOS oxide film 27b serving as the silicide protection film is formed on only the upper surface of gate electrode 6b. As shown in the table 1, the upper surface portion removed from isolating oxide film 4 has a film thickness D (total drop amount) of 4 nm. Consequently, effects similar to those of the first embodiment of the invention can be achieved.

Referring to FIGS. 26 to 29, a method of manufacturing the semiconductor device will now be described.

Figure 26:
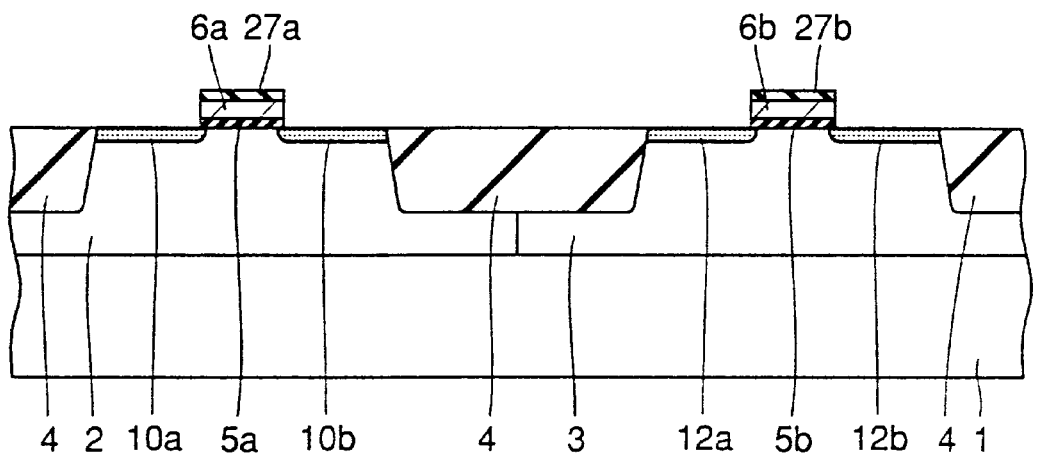
FIGS. 26 to 29 are schematic cross sections showing 1st to 4th steps in the method of manufacturing the semiconductor device shown in FIG. 25, respectively.

After executing steps for forming the structure of the semiconductor device shown in FIG. 2, an oxide film which will form the gate insulating films as well as a polycrystalline silicon film which will form the gate electrodes are formed on the main surface of semiconductor substrate 1. A TEOS oxide film is deposited on the polycrystalline silicon film thus formed. This TEOS oxide film has a thickness of about 100 nm. Then, a resist pattern is formed on the TEOS oxide film. Using this resist pattern as a mask, the TEOS oxide film is partially removed by etching. Then, this resist pattern is removed. Remaining TEOS oxide films 27a and 27b (see FIG. 26) are used as a mask, and the polycrystalline silicon film is partially removed by etching. Thereafter, the insulating film is also removed from the regions other than the regions used for gate insulating films 5a and 5b so that a structure shown in FIG. 26 is obtained.

Figure 27:
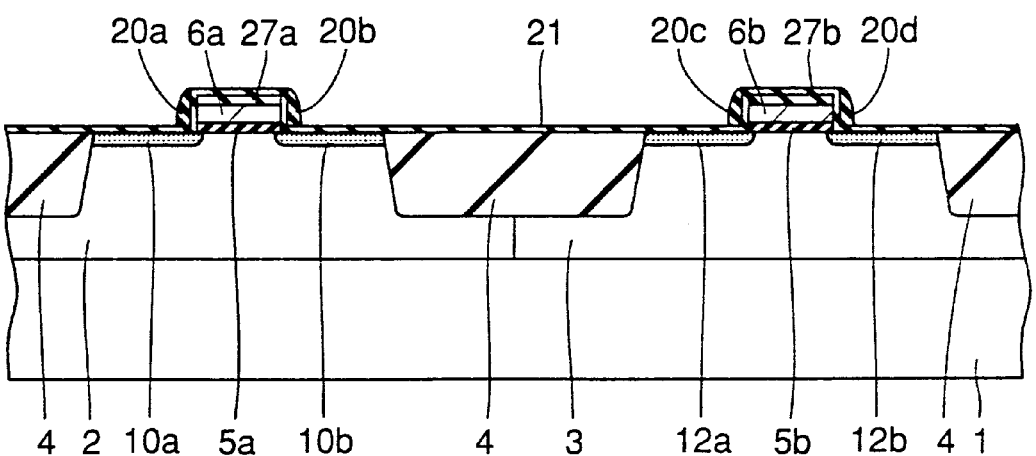

Then, TEOS oxide film 21 (see FIG. 27) is deposited on isolating oxide films 4, semiconductor substrate 1 and TEOS oxide films 27a and 27b. TEOS oxide film 21 has a thickness of about 10 nm as shown in the table 1. Then, a nitride film (not shown) is deposited on TEOS oxide film 21. This nitride film has a thickness of about 50 nm as shown in the table 1. The nitride film is etched to form side wall film portions 20a–20d as shown in FIG. 27. Then, TEOS oxide film 21 is partially removed by the etching. In this process, the upper surface of isolating oxide film 4 is over-etched and removed by thickness A (see FIG. 28). Thickness A of the removed portion is about 4 nm as shown in the table 1.

Then, n- and p-type impurities are ion-implanted into predetermined regions of semiconductor substrate 1 so that $n^+$-type impurity diffusion regions 11a and 11b as well as $p^+$-type impurity diffusion regions 13a and 13b are formed.

Figure 28:
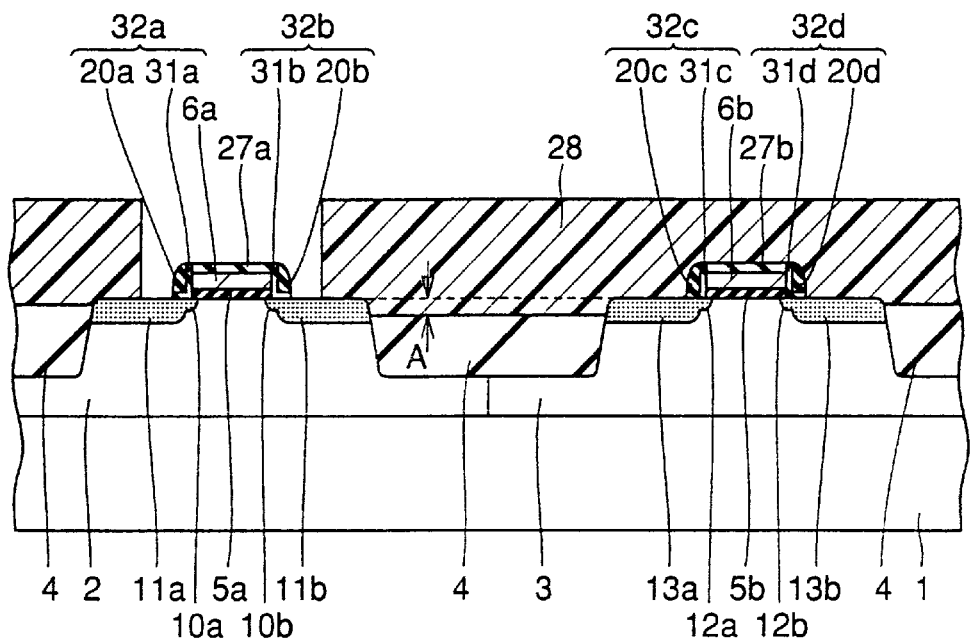
Figure 29:
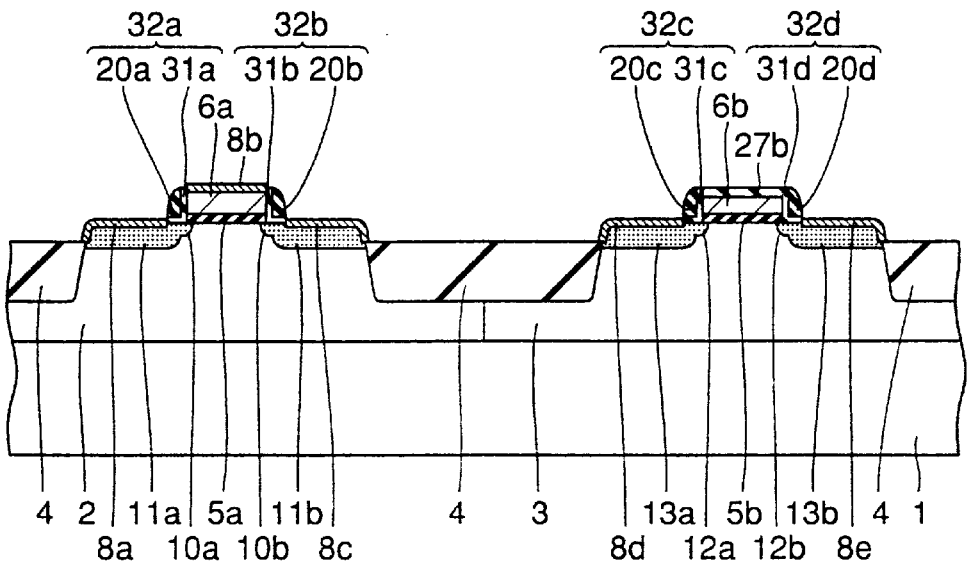
Figure 30:
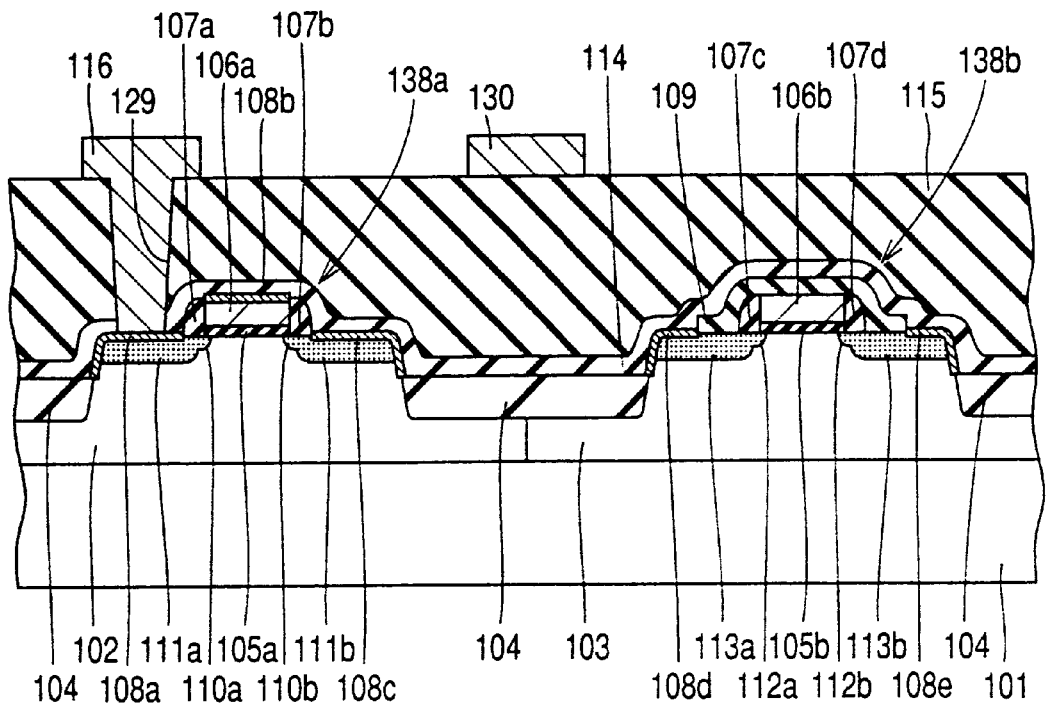
FIG. 30 is a schematic cross section showing a semiconductor device in the prior art.
Figure 31:
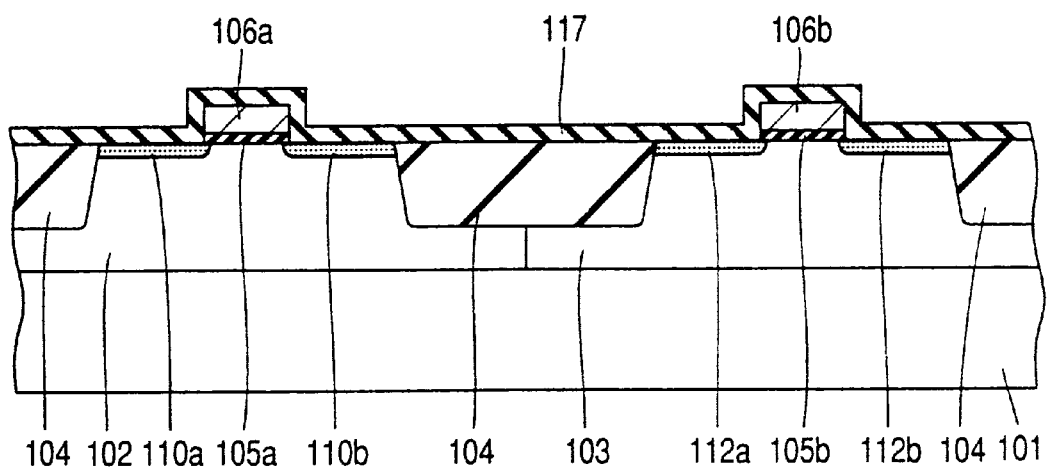
FIGS. 31 to 35 are schematic cross sections showing 1st to 5th steps in the method of manufacturing the semiconductor device shown in FIG. 30, respectively.
Figure 32:
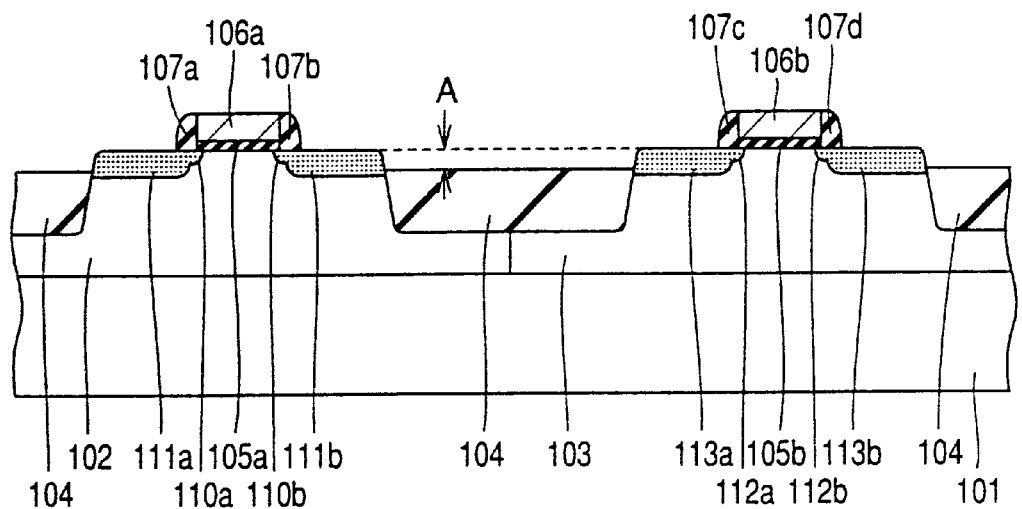
Figure 33:
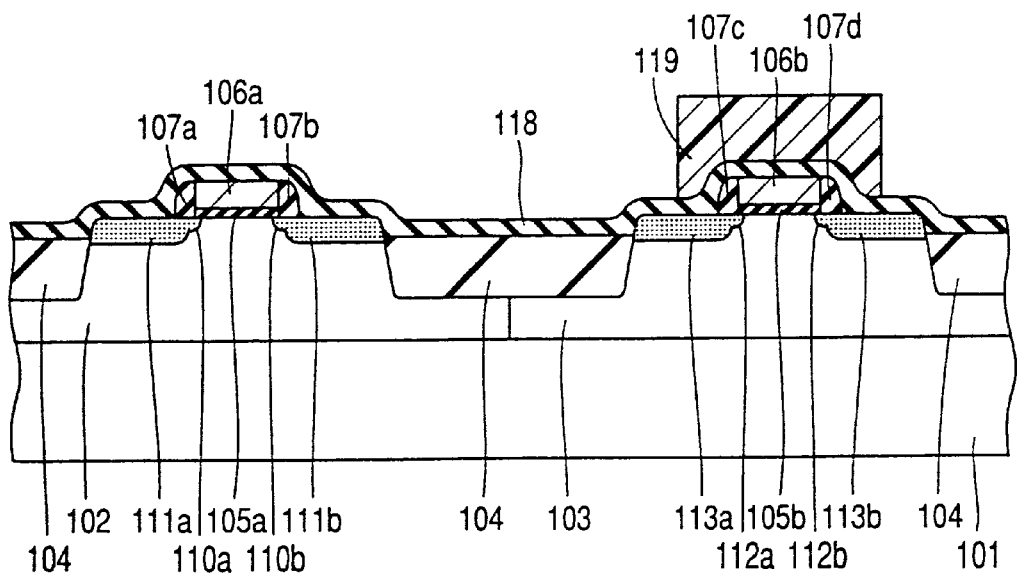
Figure 34:
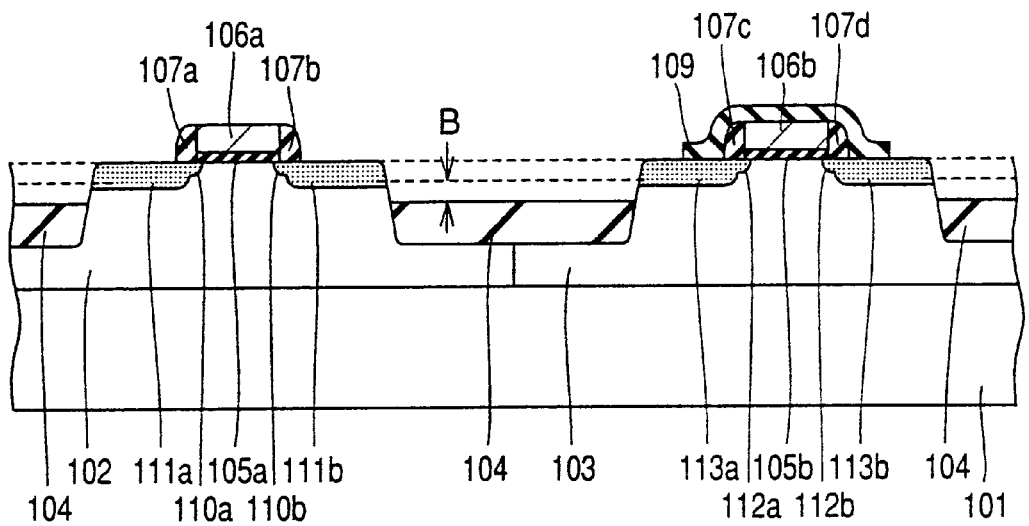
Figure 35:
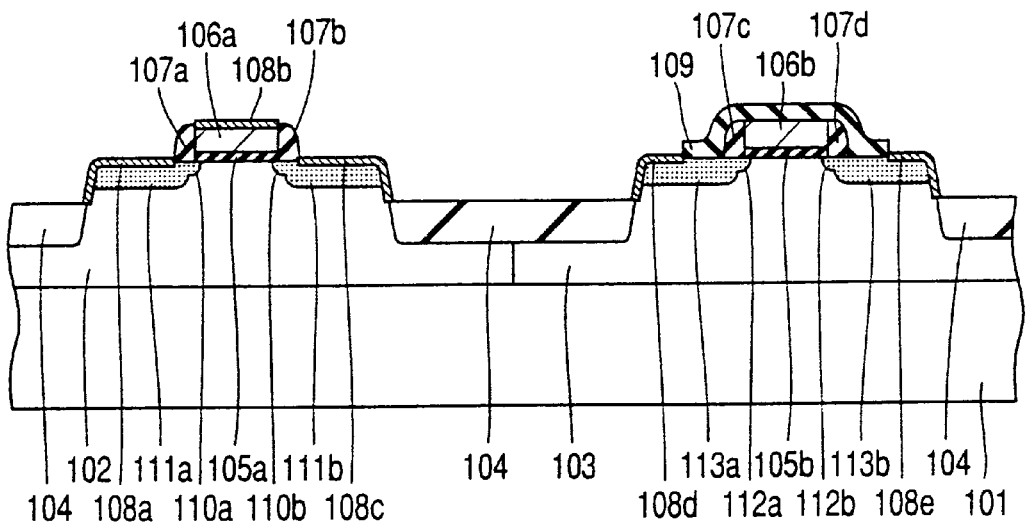
Figure 36:
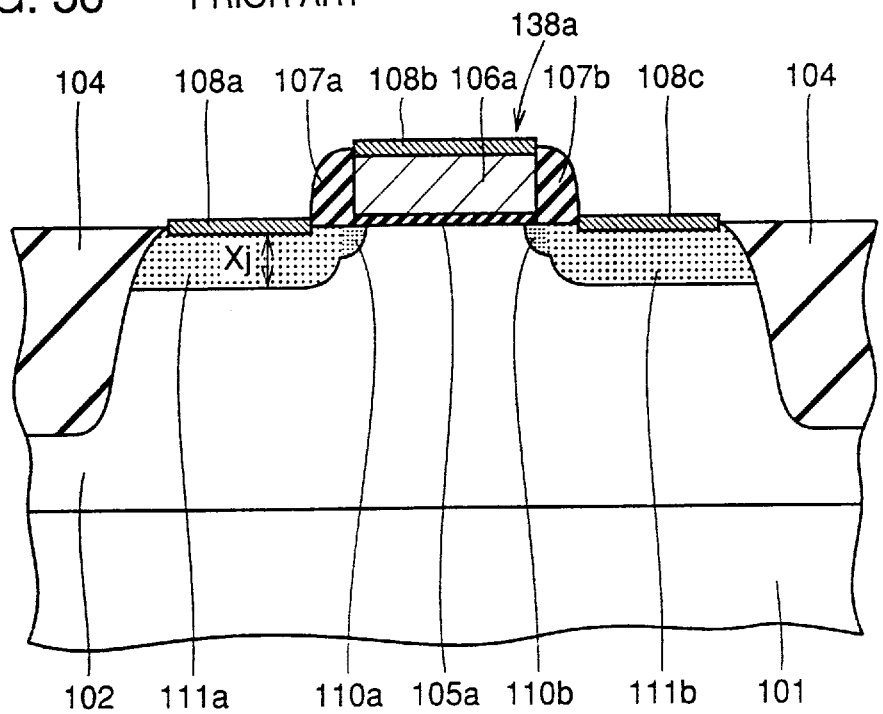
FIG. 36 is a schematic fragmentary cross section showing, on an enlarged scale, an ideal semiconductor device in the prior art.
Figure 37:
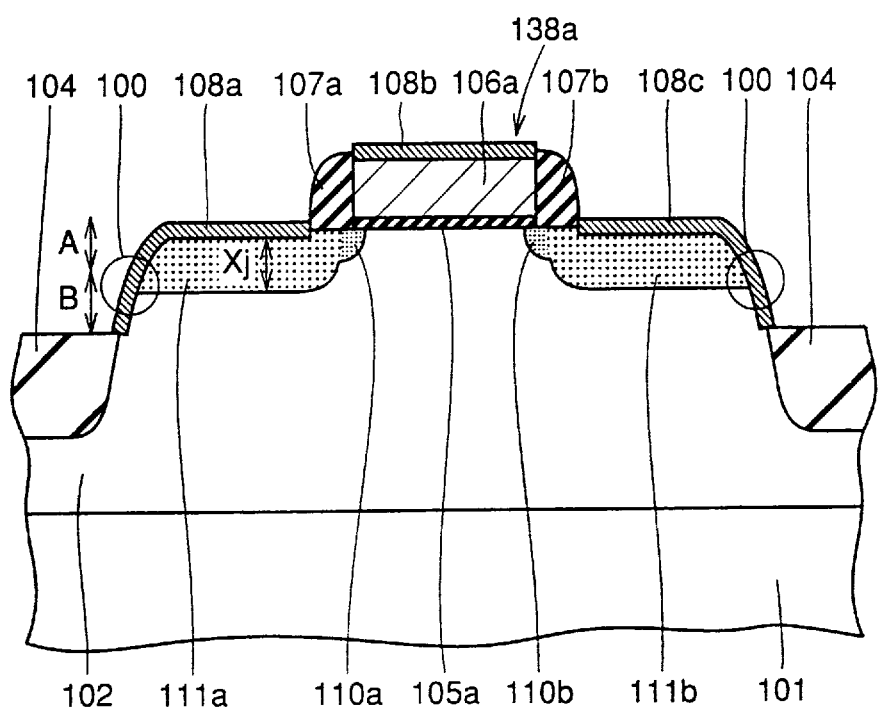
FIG. 37 is a schematic fragmentary cross section showing, on an enlarged scale, a state of a problem occurred in the conventional semiconductor device.

Then, as shown in FIG. 28, a resist pattern 28 is formed on the main surface of semiconductor substrate 1. Resist pattern 28 has a configuration exposing a region where field-effect transistor 38a (see FIG. 25) is present. Using resist pattern 28 as a mask, TEOS oxide film 27a is etched and removed. Thereafter, resist pattern 28 is removed. By employing a method similar to that of the first embodiment of the invention, high-melting-point metal silicide layers 8a–8e are formed as shown in FIG. 29. Thereafter, steps similar to those of the first embodiment of the invention are executed so that the semiconductor device shown in FIG. 25 is obtained.

In the above method, isolating oxide film 4 is subjected to only the over-etching which is performed for removing TEOS oxide film 21. In this processing, as shown in the table 1, thickness A (see FIG. 28) of the removed portion of isolating oxide film 4 is about 4 nm. Therefore, effects similar to those of the semiconductor device of the first embodiment of the invention can be achieved.

TEOS oxide film 27b serving as the silicide protection film is formed when forming gate electrodes 6a and 6b. Therefore, siliciding of gate electrode 6b can be reliably prevented. Consequently, gate electrode 6b can be utilized as a high resistance layer because the polycrystalline silicon which forms gate electrode 6b exhibits a larger electric resistance than the high-melting-point metal silicide layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

an isolating and insulating film formed on a main surface of a semiconductor substrate including a first conductivity type region to isolate an element formation region; and a field-effect transistor formed in said element formation region, said field-effect transistor including:

a second conductivity type region formed at the main surface of said semiconductor substrate and neighboring to said isolating and insulating film, a gate electrode formed on the main surface of said semiconductor substrate, a lower layer side wall film formed on a side surface of said gate electrode, an upper layer side wall film formed on said lower layer side wall film, and containing a material different from that of said lower layer side wall film, and a high-melting-point metal silicide layer formed on said second conductivity type region, and the upper surface of said isolating and insulating film being located at a level substantially equal to or lower than said main surface of said semiconductor substrate and higher than a junction boundary surface between said first and second conductivity type regions.

2. The semiconductor device according to claim 1, wherein said field-effect transistor includes a high-melting-point metal silicide layer formed on said gate electrode.

3. The semiconductor device according to claim 1, wherein said field-effect transistor includes:

a first field-effect transistor including a high-melting-point metal silicide layer formed on said gate electrode, and a second field-effect transistor not including a high-melting-point metal silicide layer formed on said gate electrode.

4. The semiconductor device according to claim 3, wherein said lower layer side wall film extends from a position on the upper surface of the gate electrode of said second field-effect transistor to a region neighboring to a region located on said second conductivity type region and provided with said high-melting-point metal silicide layer.

5. The semiconductor device according to claim 4, further comprising:

a coating film formed at the same layer level as the lower layer side wall film of said second field-effect transistor for covering said isolating and insulating film.

6. The semiconductor device according to claim 3, wherein said upper and lower layer side wall films extend from a position above the upper surface of the gate electrode of said second field-effect transistor to a region neighboring to a region located on said second conductivity type region and provided with said high-melting-point metal silicide layer.

7. The semiconductor device according to claim 6, further comprising:

a coating film formed at the same layer level as the lower layer side wall film of said second field-effect transistor for covering said isolating and insulating film.

8. The semiconductor device according to claim 3, further comprising:

a gate electrode coating film formed on only the upper surface of the gate electrode of said second field-effect transistor.

9. The semiconductor device according to claim 1, wherein said isolating and insulating film is of a trench type.

10. The semiconductor device according to claim 1, wherein said upper layer side wall film includes a silicon nitride film, and said lower layer side wall film includes a silicon oxide film.

11. A method of manufacturing a semiconductor device comprising the steps of:

forming an isolating and insulating film isolating an element formation region at a main surface of a semiconductor substrate including a first conductivity type region;

forming, in said element formation region, a second conductivity type region neighboring to said isolating and insulating film at the main surface of said semiconductor substrate;

forming a gate electrode on said semiconductor substrate;

forming a first coating film on said gate electrode and said isolating and insulating film;

forming a second coating film including a material different from that of said first coating film on said first coating film;

effecting anisotropic etching to remove said second coating film on said isolating and insulating film and form an upper layer side wall film formed of said second coating film on the side surface of said gate electrode;

effecting etching to remove said first coating film on said isolating and insulating film such that the upper surface of said isolating and insulating film is located at a lower level than the main surface of said semiconductor substrate and at a higher level that a junction boundary surface between said first and second conductivity type regions, and to form a lower layer side wall film made of the first coating film on the side surface of said gate electrode; and forming a high-melting-point metal silicide layer on said second conductivity type region.

12. The method of manufacturing the semiconductor device according to claim 11, further comprising:

a step of forming a high-melting-point metal silicide layer on said gate electrode.

13. The method of manufacturing the semiconductor device according to claim 11, further comprising the steps of:

forming a third coating film on said gate electrode and said isolating and insulating film after forming said lower layer side wall film; and forming a fourth coating film made of said third coating film on said gate electrode by removing said third coating film on said isolating and insulating film such that the upper surface of said isolating and insulating film is located at a lower level than the main surface of said semiconductor substrate and at a higher level than a junction boundary surface between said first and second conductivity type regions, said fourth coating film being used as a silicide protection film in said step of forming said high-melting-point metal silicide layer.

14. The method of manufacturing the semiconductor device according to claim 11, wherein said step of forming said lower layer side wall film includes formation of said lower layer side wall film extending onto an upper surface of said gate electrode, and said lower layer side wall film is used as a silicide protection film in said step of forming said high-melting-point metal silicide layer.

15. The method of manufacturing the semiconductor device according to claim 14, wherein said step of forming said upper layer side wall film includes formation of said upper layer side wall film extending onto the upper surface of said gate electrode, and said upper and lower layer side wall films are used as a silicide protection film in said step of forming said high-melting-point silicide layer.

16. The method of manufacturing the semiconductor device according to claim 11, wherein said step of forming said gate electrode includes the steps of:

forming a conductive film on said semiconductor substrate;

forming on said conductive film a gate coating film used as a silicide protection film in said step of forming said high-melting-point silicide layer; and forming the gate electrode and the silicide protection film by partially removing said conductive film and said gate coating film by etching.

17. A method of manufacturing a semiconductor device comprising the steps of:

forming an isolating and insulating film isolating an element formation region at a main surface of a semiconductor substrate including a first conductivity type region;

forming, in said element formation region, a second conductivity type region neighboring to said isolating and insulating film at the main surface of said semiconductor substrate;

forming a gate electrode on said semiconductor substrate;

forming a first coating film on said gate electrode and said isolating and insulating film;

forming a second coating film on said first coating film;

effecting anisotropic etching to remove partially said first and second coating films such that a surface of said second conductivity type region is exposed, and said first and second coating films are left on said gate electrode and said isolating and insulating film; and forming a high-melting-point metal silicide layer on the exposed surface of said second conductivity type region while leaving said first and second coating films on said gate electrode and said isolating and insulating film.

18. The method of manufacturing the semiconductor device according to claim 17, further comprising:

a step of forming a side wall film on the side surface of said gate electrode.

* * * * *

UNITED STATES PATENT AND TRADEMARK OFFICE
CERTIFICATE OF CORRECTION

| | |
|---|---|
| PATENT NO. | : 6,232,640 B1 |
| DATED | : May 15, 2001 |
| INVENTOR(S) | : Masakazu Okada, et al. |

It is certified that error appears in the above-identified patent and that said Letters Patent is hereby corrected as shown below:

Title Page:
After "(73) Assignee:", change "Mitsubishi Denki Kabishiki Kaisha" to
-- Mitsubishi Denki Kabushiki Kaisha --.

Signed and Sealed this

Twenty-fifth Day of September, 2001

Attest:

NICHOLAS P. GODICI
Attesting Officer
Acting Director of the United States Patent and Trademark Office